US012805073B2

(12) United States Patent
Yoo et al.

(10) Patent No.: US 12,805,073 B2
(45) Date of Patent: Nov. 17, 2026

(54) LIGHT EMITTING ELEMENT AND DISPLAY DEVICE INCLUDING THE SAME

(71) Applicant: LG DISPLAY CO., LTD., Seoul (KR)

(72) Inventors: DukKeun Yoo, Seoul (KR); JongSung Kim, Seoul (KR); Hun Jang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 481 days.

(21) Appl. No.: 18/208,118

(22) Filed: Jun. 9, 2023

(65) Prior Publication Data

US 2024/0222559 A1 Jul. 4, 2024

(30) Foreign Application Priority Data

Dec. 30, 2022 (KR) ........................ 10-2022-0190218

(51) Int. Cl.

| | |
|---|---|
| ***H10H 20/831*** | (2025.01) |
| ***H10D 86/40*** | (2025.01) |
| ***H10D 86/60*** | (2025.01) |
| ***H10H 20/81*** | (2025.01) |
| ***H10H 20/814*** | (2025.01) |
| ***H10H 20/857*** | (2025.01) |
| ***H10W 90/00*** | (2026.01) |

(52) U.S. Cl.

CPC ...... *H10H 20/8312* (2025.01); *H10D 86/441* (2025.01); *H10D 86/60* (2025.01); *H10H 20/81* (2025.01); *H10H 20/814* (2025.01); *H10H 20/857* (2025.01); *H10W 90/00* (2026.01)

(58) Field of Classification Search

CPC .. H10H 20/8312; H10H 20/81; H10H 20/814; H10H 20/857; H10H 20/835; H10H 20/83; H10H 20/841; H10H 20/84; H10H 20/85; H10H 20/852; H10H 20/856; H10H 20/819; H10H 20/831; H01L 25/0753; H01L 25/167; H10D 86/441; H10D 86/60; H10D 86/451; G09F 9/33

See application file for complete search history.

(56) References Cited

U.S. PATENT DOCUMENTS

| | | | | |
|---|---|---|---|---|
| 10,069,109 | B2 * | 9/2018 | Shin | H10K 59/124 |
| 10,825,393 | B2 * | 11/2020 | Kim | H10H 29/142 |
| 10,886,438 | B2 * | 1/2021 | Chien | H10H 20/82 |
| 11,133,431 | B2 * | 9/2021 | Ota | H01L 25/0753 |
| 2020/0303592 | A1 | 9/2020 | Kim et al. | |
| 2021/0057393 | A1 * | 2/2021 | Jeon | H10H 20/832 |
| 2022/0093833 | A1 | 3/2022 | Takiguchi et al. | |

FOREIGN PATENT DOCUMENTS

| | | |
|---|---|---|
| KR | 10-2004-0020239 A | 3/2004 |
| KR | 10-2019-0095803 A | 8/2019 |
| KR | 10-2020-0026693 A | 3/2020 |

* cited by examiner

*Primary Examiner* — Tan N Tran

(74) *Attorney, Agent, or Firm* — PnK IP LLC

(57) ABSTRACT

A light emitting element includes at least one first electrode, a first semiconductor layer, a light emitting layer, a second semiconductor layer, a second electrode, and at least one magnetic layer, wherein the magnetic layer is disposed between the first electrode and the first semiconductor layer or between the second electrode and the second semiconductor layer, wherein a cross-sectional area of the light emitting element increases from one side where the magnetic layer is disposed to an opposite side.

16 Claims, 14 Drawing Sheets

LIGHT EMITTING ELEMENT AND DISPLAY DEVICE INCLUDING THE SAME

CROSS-REFERENCE TO RELATED APPLICATION

This application claims the priority of Korean Patent Application No. 10-2022-0190218 filed on Dec. 30, 2022, which is hereby incorporated by reference in its entirety.

BACKGROUND

Field of the Disclosure

The present disclosure relates to a light emitting element and a display device including the same, and more particularly, to a light emitting diode and a display device in which light emitting diodes (LEDs) are self-assembled.

Description of the Background

Display devices used in computer monitors, TVs, and mobile phones include organic light emitting displays (OLEDs) that emit light by themselves, and liquid crystal displays (LCDs) that require a separate light source.

Display devices are being applied to more and more various fields of application including not only computer monitors and TVs, but also personal mobile devices, and thus, display devices having a reduced volume and weight while having a wide active area are being studied.

In recent years, display devices including light emitting diodes (LEDs) have drawn attention as next-generation display devices. Since the LED is formed of an inorganic material rather than an organic material, it has excellent reliability and has a longer lifespan compared to a liquid crystal display or an organic light emitting display. In addition, the LED has a high lighting speed, high luminous efficiency and excellent stability due to high impact resistance and may display a high-luminance image.

SUMMARY

The present disclosure is to provide a light emitting element for improving light efficiency and a display device including the same.

The present disclosure is also to provide a display device allowing for minimization of a transfer tolerance through a reduction of a transfer process.

The present disclosure is also to provide a display device allowing for process optimization through a reduction of a transfer process.

The present disclosure is not limited to the above-mentioned features, which are not mentioned above, may be clearly understood by those skilled in the art from the following descriptions. Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

In an exemplary aspect of the present disclosure, a light emitting element includes at least one first electrode, a first semiconductor layer, a light emitting layer, a second semiconductor layer, a second electrode, and at least one magnetic layer, wherein the magnetic layer is disposed between the first electrode and the first semiconductor layer or between the second electrode and the second semiconductor layer, wherein a cross-sectional area of the light emitting element increases from one side where the magnetic layer is disposed to an opposite side.

In an exemplary aspect of the present disclosure, a display device includes a substrate including a plurality of sub-pixels; transistors disposed in each of the plurality of sub-pixels; a first assembly electrode and a second assembly electrode disposed in each of the plurality of sub-pixels and spaced apart from each other; a passivation layer covering the first assembly electrode and the second assembly electrode; and a plurality of light emitting elements disposed on the passivation layer between the first assembly electrode and the second assembly electrode and including a first electrode, a first semiconductor layer, a light emitting layer, a second semiconductor layer, a second electrode, and a magnetic layer, wherein the magnetic layer is disposed between the first electrode and the first semiconductor layer, wherein a cross-sectional width of the plurality of light emitting elements increases from one side where the magnetic layer is disposed to an opposite side.

In an exemplary aspect of the present disclosure, a display device includes a substrate including a plurality of sub-pixels; transistors disposed in each of the plurality of sub-pixels; a lower reflective layer disposed in each of the plurality of sub-pixels; and a plurality of light emitting elements disposed in each of the plurality of sub-pixels on the lower reflective layer and including at least one first electrode, a first semiconductor layer, a light emitting layer, a second semiconductor layer, a second electrode, and at least one magnetic layer, wherein the magnetic layer is disposed between the first electrode and the first semiconductor layer or between the second electrode and the second semiconductor layer, wherein a cross-sectional width of the plurality of light emitting elements increases from one side where the magnetic layer is disposed to an opposite side.

Other detailed matters of the exemplary aspects are included in the detailed description and the drawings.

According to the present disclosure, light efficiency may be improved by including a reflective layer disposed on a side surface or a lower surface of a light emitting element.

According to the present disclosure, a luminance deviation may be improved by minimizing a transfer tolerance.

According to the present disclosure, a process may be optimized through process reduction.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure. In the Drawings.

DETAILED DESCRIPTION

Figure 1:
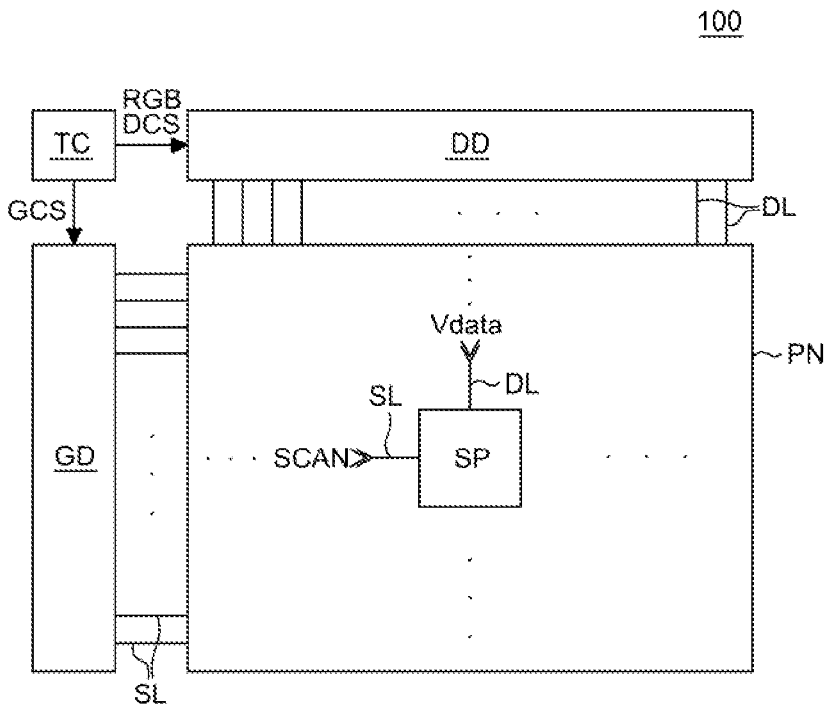
FIG. 1 is a schematic configuration diagram of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art may fully understand the disclosures of the present disclosure and the scope of the present disclosure.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the disclosure. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the disclosure.

A size and a thickness of each component illustrated in the drawing are illustrated for convenience of description, and the present disclosure is not limited to the size and the thickness of the component illustrated.

The features of various aspects of the present disclosure may be partially or entirely adhered to or combined with each other and may be interlocked and operated in technically various ways, and the aspects may be carried out independently of or in association with each other.

Hereinafter, the present disclosure will be described in detail with reference to accompanying drawings.

FIG. 1 is a schematic configuration diagram of a display device according to an exemplary aspect of the present disclosure. In FIG. 1, only a display panel PN, a gate driver GD, a data driver DD, and a timing controller TC among various components of a display device 100 are illustrated for convenience of description.

Referring to FIG. 1, the display device 100 includes the display panel PN including a plurality of sub-pixels SP, the gate driver GD and the data driver DD for supplying various signals to the display panel PN, and the timing controller TC for controlling the gate driver GD and the data driver DD.

The display panel PN, a component for displaying an image to a user, includes the plurality of sub-pixels SP. In the display panel PN, a plurality of scan lines SL and a plurality of data lines DL cross each other, and each of the plurality of sub-pixels SP is connected to the scan line SL and the data line DL. In addition, each of the plurality of sub-pixels SP may be connected to high potential power supply lines, low potential power supply lines, reference lines, and the like.

Each of the plurality of sub-pixels SP is a minimum unit constituting a screen and includes a light emitting element and a pixel circuit for driving the light emitting element. A plurality of light emitting elements may be differently defined according to a type of display panel PN. For example, when the display panel PN is an inorganic light emitting display panel, the light emitting element may be a light emitting diode (LED) or a micro-light emitting diode (LED).

The gate driver GD supplies a plurality of scan signals SCAN to the plurality of scan lines SL according to a plurality of gate control signals GCS provided from the timing controller TC. Although FIG. 1 shows that one gate driver GD is disposed to be spaced apart from one side of the display panel PN, the number and arrangement of gate drivers GD are not limited thereto.

The data driver DD converts image data RGB input from the timing controller TC into a data voltage Vdata using a reference gamma voltage according to a plurality of data control signals DCS provided from the timing controller TC. The data driver DD may supply the converted data voltage Vdata to the plurality of data lines DL.

The timing controller TC aligns image data RGB input from the outside and supplies it to the data driver DD. The timing controller TC may generate a gate control signal GCS and a data control signal DCS using synchronization signals input from the outside, for example, a dot clock signal, a data enable signal, and a horizontal/vertical synchronization signal. In addition, the timing controller TC may supply the generated gate control signal GCS and data control signal DCS to the gate driver GD and the data driver DD, respectively, to thereby control the gate driver GD and the data driver DD.

Hereinafter, the plurality of sub-pixels SP of the display panel PN of the display device 100 according to an exemplary aspect of the present disclosure will be described in more detail.

Figure 2:
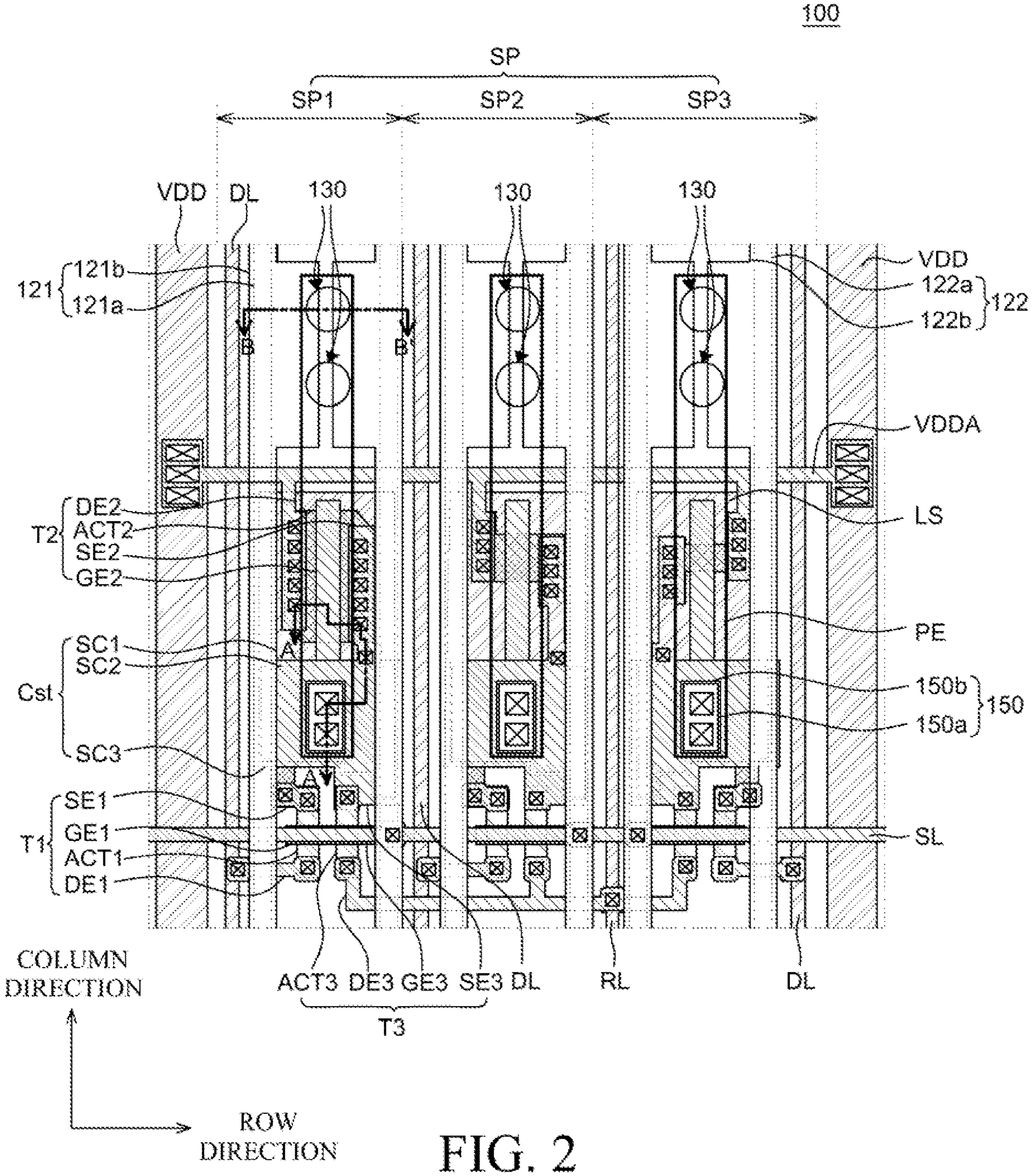
FIG. 2 is an enlarged plan view of the display device according to an exemplary aspect of the present disclosure.
Figure 3:
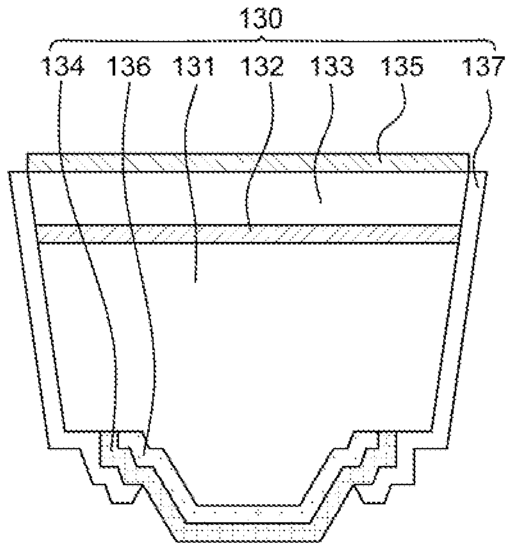
FIG. 3 is a cross-sectional view of a light emitting element of the display device according to an exemplary aspect of the present disclosure.
Figure 4:
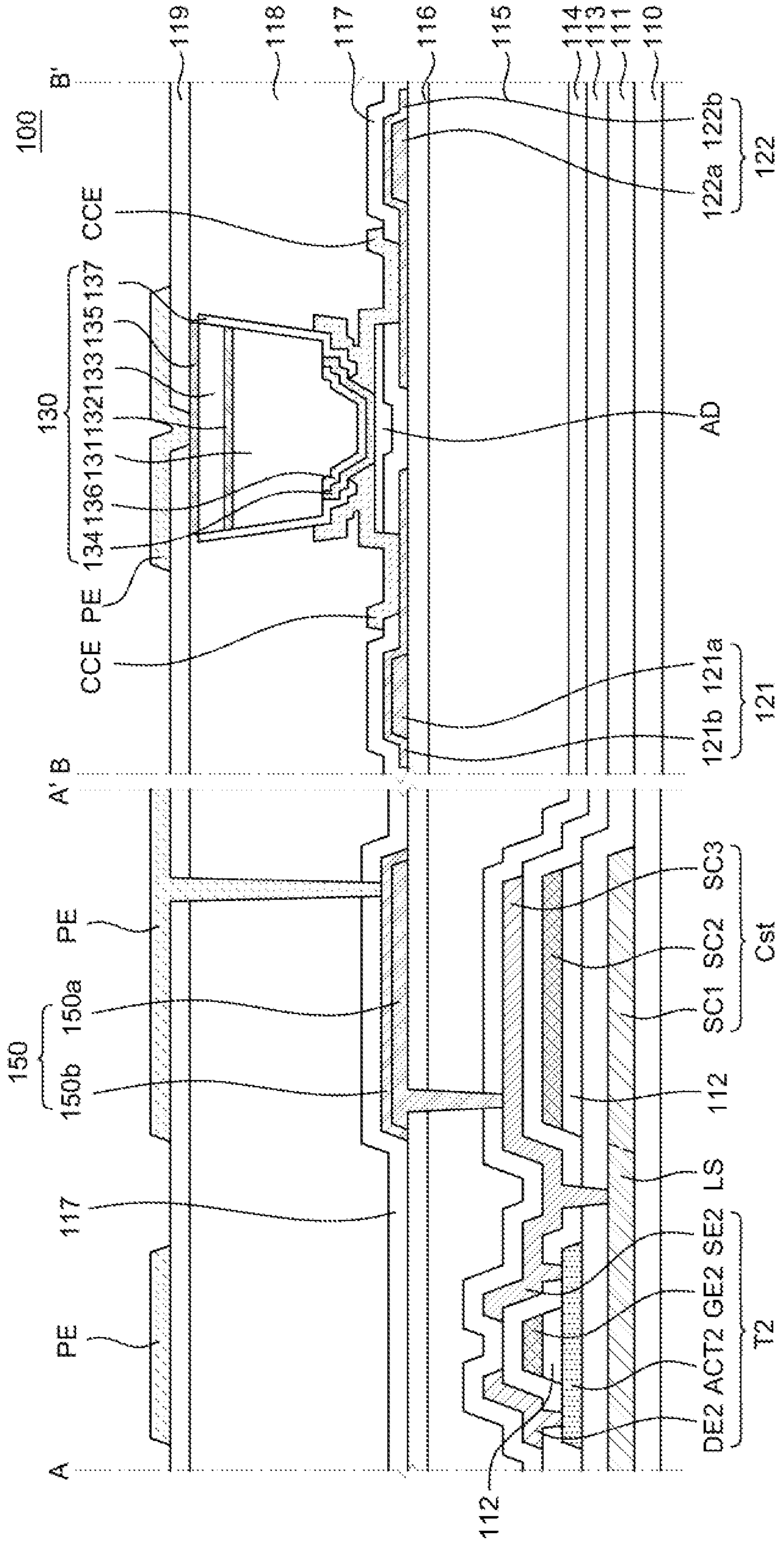
FIG. 4 is a cross-sectional view taken along A-A' and B-B' of FIG. 2.

FIG. 2 is an enlarged plan view of the display device according to an exemplary aspect of the present disclosure. FIG. 3 is a cross-sectional view of a light emitting element of the display device according to an exemplary aspect of the present disclosure. FIG. 4 is a cross-sectional view taken along A-A' and B-B' of FIG. 2.

Referring to FIGS. 2 to 4, each of the plurality of sub-pixels SP includes a first transistor T1, a second transistor T2, a third transistor T3, a storage capacitor Cst, and one or more light emitting elements 130. In FIG. 2, hatchings of first assembly electrodes 121, second assembly electrodes 122, the light emitting elements 130, and pixel electrodes PE are omitted for convenience of description.

Referring to FIG. 2, the plurality of sub-pixels SP includes a first sub-pixel SP1, a second sub-pixel SP2, and a third sub-pixel SP3. Each of the first sub-pixel SP1, the second sub-pixel SP2, and the third sub-pixel SP3 may include the light emitting element 130 and a circuit to independently emit light. For example, the first sub-pixel SP1 may be a red sub-pixel, the second sub-pixel SP2 may be a green sub-pixel, and the third sub-pixel SP3 may be a blue sub-pixel, but the present disclosure is not limited thereto.

The display device 100 includes a substrate 110, a buffer layer 111, a gate insulating layer 112, an interlayer insulating layer 113, a first passivation layer 114, a first planarization layer 115, a second passivation layer 116, a third passivation layer 117, a second planarization layer 118, and a fourth passivation layer 119.

First, the substrate 110 is a component to support various components included in the display device 100 and may be formed of an insulating material. For example, the substrate 110 may be formed of glass, resin or the like. In addition, the substrate 110 may be formed to include a polymer or plastic, or may be formed of a material having flexibility.

High potential power supply lines VDD, the plurality of data lines DL, reference lines RL, a light shielding layer LS, and first capacitor electrodes SC1 are disposed on the substrate 110.

The high potential power supply line VDD is a line that transmits a high potential power supply voltage to each of the plurality of sub-pixels SP. The plurality of high potential power supply lines VDD may transmit high potential power supply voltages to the second transistors T2 of the plurality of respective sub-pixels SP. The high potential power supply line VDD may extend in a column direction between the plurality of sub-pixels SP. For example, the high potential power supply line VDD may be disposed in the column direction between the first sub-pixel SP1 and the third sub-pixel SP3. In addition, the high potential power supply line VDD may transmit a high potential power supply voltage to each of the plurality of sub-pixels SP disposed in a row direction through an auxiliary high potential power supply line VDDA, which will be described later.

The plurality of data lines DL are lines that transfer data voltages Vdata to each of the plurality of sub-pixels SP. The plurality of data lines DL may be connected to the first transistors T1 of the plurality of respective sub-pixels SP. The plurality of data lines DL may extend in the column direction between the plurality of sub-pixels SP. For example, the data line DL extending in the column direction between the first sub-pixel SP1 and the high potential power supply line VDD may transfer the data voltage Vdata to the first sub-pixel SP1, the data line DL disposed between the first sub-pixel SP1 and the second sub-pixel SP2 may transfer the data voltage Vdata to the second sub-pixel SP2, and the data line DL disposed between the third sub-pixel SP3 and the high potential power supply line VDD may transfer the data voltage Vdata to the third sub-pixel SP3.

The reference line RL is a line that transmits a reference voltage to each of the plurality of sub-pixels SP. The reference lines RL may be connected to the third transistors T3 of the plurality of respective sub-pixels SP. The reference line RL may extend in the column direction between the plurality of sub-pixels SP. For example, the reference line RL may extend in the column direction between the second sub-pixel SP2 and the third sub-pixel SP3. A third drain electrode DE3 of the third transistor T3 of each of the first sub-pixel SP1, the second sub-pixel SP2, and the third sub-pixel SP3 adjacent to the reference lines RL may extend in the row direction and be electrically connected to the reference line RL.

The light shielding layer LS is disposed on the substrate 110 in each of the plurality of sub-pixels SP. The light shielding layer LS may block light incident on the transistor from a lower portion of the substrate 110 to minimize leakage current. For example, the light shielding layer LS may block light incident on a second active layer ACT2 of the second transistor T2 that is a driving transistor.

The first capacitor electrode SC1 is disposed on the substrate 110 in each of the plurality of sub-pixels SP. The first capacitor electrode SC1, together with other capacitor electrodes, may form the storage capacitor Cst. The first capacitor electrode SC1 may be integrally formed with the light shielding layer LS.

The buffer layer 111 is disposed on the high potential power supply lines VDD, the plurality of data lines DL, the reference lines RL, the light shielding layer LS, and the first capacitor electrodes SC1. The buffer layer 111 may reduce penetration of moisture or impurities through the substrate 110. The buffer layer 111 may be composed of, for example, a single layer or multiple layers of silicon oxide (SiOx) or silicon nitride (SiNx), but is not limited thereto. However, the buffer layer 111 may be omitted depending on a type of substrate 110 or a type of transistor, but is not limited thereto.

First, the first transistor T1 is disposed on the buffer layer 111 in each of the plurality of sub-pixels SP. The first transistor T1 transfers the data voltage Vdata to a second gate electrode GE2 of the second transistor T2. The first transistor T1 may be turned on by a scan signal SCAN from the scan line SL, and the data voltage Vdata from the data line DL may be transmitted to the second gate electrode GE2 of the second transistor T2 through the turned on first transistor T1. Accordingly, the first transistor T1 may be referred to as a switching transistor.

The first transistor T1 includes a first active layer ACT1, a first gate electrode GE1, a first source electrode SE1, and a first drain electrode DE1.

The first active layer ACT1 is disposed on the buffer layer 111. The first active layer ACT1 may be formed of a semiconductor material such as an oxide semiconductor, amorphous silicon, or polysilicon, but is not limited thereto.

The gate insulating layer 112 is disposed on the first active layer ACT1. The gate insulating layer 112 is an insulating layer for insulating the first active layer ACT1 and the first gate electrode GE1, and may be composed of a single layer or multiple layers of silicon oxide (SiOx) or silicon nitride (SiNx). However, the present disclosure is not limited thereto.

The first gate electrode GE1 is disposed on the gate insulating layer 112. The first gate electrode GE1 may be electrically connected to the scan line SL. The first gate electrode GE1 may be formed of a conductive material such as copper (Cu), aluminum (Al), molybdenum (Mo), nickel (Ni), titanium (Ti), chromium (Cr), or an alloy thereof, but is not limited thereto.

The interlayer insulating layer 113 is disposed on the first gate electrode GE1. Contact holes for connecting each of the first source electrode SE1 and the first drain electrode DE1 to the first active layer ACT1 are formed in the interlayer insulating layer 113. The interlayer insulating layer 113 is an insulating layer for protecting components under the interlayer insulating layer 113, and may be composed of a single layer or multiple layers of silicon oxide (SiOx) or silicon nitride (SiNx), but is not limited thereto.

The first source electrode SE1 and the first drain electrode DE1 electrically connected to the first active layer ACT1 are disposed on the interlayer insulating layer 113. The first drain electrode DE1 may be connected to the data line DL and the first active layer ACT1, and the first source electrode SE1 may be connected to the first active layer ACT1 and the gate electrode GE2 of the second transistor T2. The first source electrode SE1 and the first drain electrode DE1 may be formed of a conductive material, for example, copper (Cu), aluminum (Al), molybdenum (Mo), nickel (Ni), titanium (Ti), chromium (Cr) or an alloy thereof, but is not limited thereto.

The second transistor T2 is disposed on the buffer layer 111 in each of the plurality of sub-pixels SP. The second transistor T2 is a transistor that supplies a driving current to the light emitting element 130. The second transistor T2 may be turned on to control a driving current flowing to the light emitting element 130. Accordingly, the second transistor T2 for controlling the driving current may be referred to as a driving transistor.

The second transistor T2 includes the second active layer ACT2, the second gate electrode GE2, a second source electrode SE2, and a second drain electrode DE2.

The second active layer ACT2 is disposed on the buffer layer 111. The second active layer ACT2 may be formed of a semiconductor material such as an oxide semiconductor, amorphous silicon, or polysilicon, but is not limited thereto.

The gate insulating layer 112 is disposed on the second active layer ACT2, and the second gate electrode GE2 is disposed on the gate insulating layer 112. The second gate electrode GE2 may be electrically connected to the first source electrode SE1 of the first transistor T1. The second gate electrode GE2 may be formed of a conductive material such as copper (Cu), aluminum (Al), molybdenum (Mo), nickel (Ni), titanium (Ti), chromium (Cr), or an alloy thereof, but is not limited thereto.

The interlayer insulating layer 113 is disposed on the second gate electrode GE2, and the second source electrode SE2 and the second drain electrode DE2 electrically connected to the second active layer ACT2 are disposed on the interlayer insulating layer 113. The second drain electrode DE2 may be electrically connected to the second active layer ACT2 and the high potential power supply line VDD, and the second source electrode SE2 may be connected to the second active layer ACT2 and the light emitting element 130. The second source electrode SE2 and the second drain electrode DE2 may be formed of a conductive material, for example, copper (Cu), aluminum (Al), molybdenum (Mo), nickel (Ni), titanium (Ti), chromium (Cr) or an alloy thereof, but is not limited thereto.

The third transistor T3 is disposed on the buffer layer 111 in each of the plurality of sub-pixels SP. The third transistor T3 is a transistor for compensating for a threshold voltage of the second transistor T2. The third transistor T3 is connected between the second source electrode SE2 of the second transistor T2 and the reference line RL. The third transistor T3 may be turned on and transfer a reference voltage to the second source electrode SE2 of the second transistor T2 to sense the threshold voltage of the second transistor T2. Accordingly, the third transistor T3 that senses characteristics of the second transistor T2 may be referred to as a sensing transistor.

The third transistor T3 includes a third active layer ACT3, a third gate electrode GE3, a third source electrode SE3, and the third drain electrode DE3.

The third active layer ACT3 is disposed on the buffer layer 111. The third active layer ACT3 may be formed of a semiconductor material such as an oxide semiconductor, amorphous silicon, or polysilicon, but is not limited thereto.

The gate insulating layer 112 is disposed on the third active layer ACT3, and the third gate electrode GE3 is disposed on the gate insulating layer 112. The third gate electrode GE3 may be electrically connected to the scan line SL. The third gate electrode GE3 may be formed of a conductive material such as copper (Cu), aluminum (Al), molybdenum (Mo), nickel (Ni), titanium (Ti), chromium (Cr), or an alloy thereof, but is not limited thereto.

The interlayer insulating layer 113 is disposed on the third gate electrode GE3, and the third source electrode SE3 and the third drain electrode DE3 electrically connected to the third active layer ACT3 are disposed on the interlayer insulating layer 113. The third drain electrode DE3 may be electrically connected to the third active layer ACT3 and the reference line RL, and the third source electrode SE3 may be electrically connected to the third active layer ACT3 and the second source electrode SE2 of the second transistor T2. The third source electrode SE3 and the third drain electrode DE3 may be formed of a conductive material, for example, copper (Cu), aluminum (Al), molybdenum (Mo), nickel (Ni), titanium (Ti), chromium (Cr) or an alloy thereof, but is not limited thereto.

A second capacitor electrode SC2 is disposed on the gate insulating layer 112. The second capacitor electrode SC2 is one of electrodes forming the storage capacitor Cst and may be disposed to overlap the first capacitor electrode SC1. The second capacitor electrode SC2 is integrally formed with the second gate electrode GE2 of the second transistor T2 and may be electrically connected to the second gate electrode GE2. The first capacitor electrode SC1 and the second capacitor electrode SC2 may be spaced apart from each other with the buffer layer 111 and the gate insulating layer 112 interposed therebetween.

In addition, the plurality of scan lines SL, the auxiliary high potential power supply line VDDA, and a third capacitor electrode SC3 are disposed on the interlayer insulating layer 113.

First, the scan line SL is a line that transmits a scan signal to each of the plurality of sub-pixels SP. The scan line SL may cross the plurality of sub-pixels SP and extend in the row direction. The scan line SL may be electrically connected to the first gate electrode GE1 of the first transistor T1 and the third gate electrode GE3 of the third transistor T3 of each of the plurality of sub-pixels SP.

The auxiliary high potential power supply line VDDA is disposed on the interlayer insulating layer 113. The auxiliary high potential power supply line VDDA may extend in the row direction and may be disposed across the plurality of sub-pixels SP. The auxiliary high potential power supply line VDDA may be electrically connected to the high potential power supply lines VDD extending in the column direction and the second drain electrodes DE2 of the second transistors T2 of the plurality of respective sub-pixels SP disposed in the row direction.

The third capacitor electrode SC3 is disposed on the interlayer insulating layer 113. The third capacitor electrode SC3 is an electrode forming the storage capacitor Cst, and may be disposed to overlap the first capacitor electrode SC1 and the second capacitor electrode SC2. The third capacitor electrode SC3 may be integrally formed with the second source electrode SE2 of the second transistor T2 and electrically connected to the second source electrode SE2. Also, the second source electrode SE2 may also be electrically connected to the first capacitor electrode SC1 through a contact hole formed in the interlayer insulating layer 113 and the buffer layer 111. Accordingly, the first capacitor electrode SC1 and the third capacitor electrode SC3 may be electrically connected to the second source electrode SE2 of the second transistor T2.

The storage capacitor Cst may store a potential difference between the second gate electrode GE2 and the second source electrode SE2 of the second transistor T2 while the light emitting element 130 emits light, so that a constant current is supplied to the light emitting element 130. The storage capacitor Cst includes the first capacitor electrode SC1 formed on the substrate 110 and connected to the second source electrode SE2, the second capacitor electrode SC2 formed on the buffer layer 111 and the gate insulating layer 112 and connected to the gate electrode GE2, and the third capacitor electrode SC3 formed on the interlayer insulating layer 113 and connected to the second source electrode SE2, so that the storage capacitor Cst may store a voltage between the second gate electrode GE2 and the second source electrode SE2 of the second transistor T2.

The first passivation layer 114 is disposed on the first transistor T1, the second transistor T2, the third transistor T3, and the storage capacitor Cst. The first passivation layer 114 is an insulating layer for protecting components under the first passivation layer 114, and may be composed of a single layer or multiple layers of silicon oxide (SiOx) or silicon nitride (SiNx), but is limited thereto.

The first planarization layer 115 is disposed on the first passivation layer 114. The first planarization layer 115 may planarize an upper portion of the substrate 110 on which the plurality of transistors T1, T2 and T3 and the storage capacitor Cst are disposed. The first planarization layer 115 may be composed of a single layer or multiple layers, and may be formed of, for example, an acryl-based organic material, but is not limited thereto.

The second passivation layer 116 is disposed on the first planarization layer 115. The second passivation layer 116 is an insulating layer for protecting components under the second passivation layer 116, and may be composed of a single layer or multiple layers of silicon oxide (SiOx) or silicon nitride (SiNx), but is limited thereto.

Connection units 150, the first assembly electrodes 121, and the second assembly electrodes 122 are disposed on the second passivation layer 116.

First, the connection unit 150 is disposed in each of the plurality of sub-pixels SP. The connection unit 150 is an electrode that electrically connects the second transistor T2 and the pixel electrode PE. The connection unit 150 may be electrically connected to the second source electrode SE2 and the third capacitor electrode SC3 through a contact hole formed in the second passivation layer 116, the first planarization layer 115, and the first passivation layer 114.

The connection unit 150 may have a multilayer structure including a first connection layer 150*a* and a second connection layer 150*b*. The first connection layer 150*a* is disposed on the second passivation layer 116, and the second connection layer 150*b* covering the first connection layer 150*a* is disposed. The second connection layer 150*b* may be disposed to surround both an upper surface and a side surface of the first connection layer 150*a*. The second connection layer 150*b* is formed of a material that is more resistant to corrosion compared to the first connection layer 150*a*, and thus, may minimize a short circuit defect due to migration between the first connection layer 150*a* and adjacent lines when the display device 100 is manufactured. For example, the first connection layer 150*a* may be formed of a conductive material such as copper (Cu) or chromium (Cr), and the second connection layer 150*b* may be formed of molybdenum (Mo) or molybdenum titanium (MoTi), but the present disclosure is not limited thereto.

The first assembly electrode 121 and the second assembly electrode 122 are disposed on the second passivation layer 116. The first assembly electrode 121 and the second assembly electrode 122 are lines that transfer a low potential power supply voltage to the light emitting element 130. Accordingly, the first assembly electrode 121 and the second assembly electrode 122 may be referred to as low potential power supply lines. A plurality of the first assembly electrodes 121 and second assembly electrodes 122 may be disposed in each of the plurality of sub-pixels SP and may extend in the column direction to be spaced apart from each other. For example, pairs of the first assembly electrodes 121 and the second assembly electrodes 122 spaced apart from each other at a predetermined interval may be disposed in each of the first sub-pixel SP1, the second sub-pixel SP2, and the third sub-pixel SP3.

Meanwhile, the first assembly electrode 121 and the second assembly electrode 122 may function as electrodes for self-assembling the light emitting elements 130. For example, when manufacturing the display device 100, the first assembly electrode 121 and the second assembly electrode 122 may form an electric field so that the light emitting element 130 may be self-assembled.

Each of the first assembly electrode 121 and the second assembly electrode 122 includes conductive layers 121*a* and 122*a* and cladding layers 121*b* and 122*b*. That is, the first assembly electrode 121 includes a first conductive layer 121*a* and a first cladding layer 121*b*, and the second assembly electrode 122 includes a second conductive layer 122*a* and a second cladding layer 122*b*.

The conductive layers 121*a* and 122*a* of the first assembly electrode 121 and the second assembly electrode 122 are disposed on the second passivation layer 116, and the cladding layers 121*b* and 122*b* thereof are disposed on the conductive layers 121*a* and 122*a* to cover both upper surfaces and side surfaces of the conductive layers 121*a* and 122*a*. For example, the conductive layers 121*a* and 122*a* may be formed of a conductive material such as copper (Cu) or chromium (Cr). The cladding layers 121*b* and 122*b* may be formed of a material that is more resistant to corrosion compared to the conductive layers 121*a* and 122*a*, for example, molybdenum (Mo), molybdenum titanium (MoTi) or the like, but the present disclosure is not limited thereto.

The cladding layers 121*b* and 122*b* of the first assembly electrodes 121 and the second assembly electrodes 122 may protrude toward areas where the plurality of light emitting elements 130 are disposed. Accordingly, the cladding layers 121*b* and 122*b* are configured to overlap the areas where the plurality of light emitting elements 130 are disposed, so that each of the first assembly electrodes 121 and the second assembly electrodes 122 may function as electrodes for self-assembling the light emitting elements 130.

The third passivation layer 117 is disposed on the connection unit 150, the first assembly electrode 121, and the second assembly electrode 122. The third passivation layer 117 is an insulating layer for protecting components under the third passivation layer 117, and may be composed of a single layer or multiple layers of silicon oxide (SiOx) or silicon nitride (SiNx), but is limited thereto.

Next, the plurality of light emitting elements 130 are disposed on the third passivation layer 117. One or more light emitting elements 130 are disposed in one sub-pixel SP. The light emitting element 130 is an element that emits light by current. The light emitting elements 130 may include light emitting elements 130 that emit red light, green light, blue light, and the like, and through a combination thereof, may implement light of various colors including white. In addition, light of various colors may be implemented by using the light emitting element 130 that emits light of a specific color and a light conversion member that converts light from the light emitting element 130 into light of a different color. The light emitting element 130 is electrically connected between the second transistor T2 and the first assembly electrode 121 and the second assembly electrode 122, and may receive a driving current from the second transistor T2 to emit light.

In this case, the plurality of light emitting elements 130 disposed in one sub-pixel SP may be connected in parallel. That is, one electrode of each of the plurality of light emitting elements 130 may be connected to the source electrode of the same second transistor T2, and the other electrode thereof may be connected to the same assembly electrodes 121 and 122.

Meanwhile, the light emitting elements 130 disposed in each of the plurality of sub-pixels SP may have the same structure. However, the present disclosure is not limited thereto, and the light emitting elements 130 disposed in each of the plurality of sub-pixels SP may have different structures. In addition, although FIG. 2 illustrates that two light emitting elements 130 are disposed in each of the plurality of sub-pixels SP for convenience of description, the number of the light emitting elements 130 disposed in each of the plurality of sub-pixels SP is not limited thereto.

Referring to FIGS. 3 and 4, each of the plurality of light emitting elements 130 includes a first semiconductor layer 131, a light emitting layer 132, a second semiconductor layer 133, a first electrode 134, a second electrode 135, a magnetic layer 136, and an encapsulation layer 137.

The first semiconductor layer 131 is disposed on the third passivation layer 117, and the second semiconductor layer 133 is disposed on the first semiconductor layer 131. The first semiconductor layer 131 and the second semiconductor layer 133 may be layers formed by doping a specific material with n-type impurities and p-type impurities. For example, each of the first semiconductor layer 131 and the second semiconductor layer 133 may be layers formed by doping materials such as gallium nitride (GaN), indium aluminum phosphide (InAlP), gallium arsenide (GaAs), and the like, with n-type impurities or p-type impurities. In addition, the p-type impurity may be magnesium (Mg), zinc (Zn), beryllium (Be) or the like, and the n-type impurity may be silicon (Si), germanium (Ge), tin (Sn) or the like, but the present disclosure is not limited thereto.

The light emitting layer 132 is disposed between the first semiconductor layer 131 and the second semiconductor layer 133. The light emitting layer 132 may emit light by receiving holes and electrons from the first semiconductor layer 131 and the second semiconductor layer 133. The light emitting layer 132 may be formed of a single or multi-quantum well (MQW) structure, and may be formed of, for example, indium gallium nitride (InGaN) or gallium nitride (GaN), but the present disclosure is not limited thereto.

The first electrode 134 is disposed below the first semiconductor layer 131. The first electrode 134 is an electrode for electrically connecting the first semiconductor layer 131 and the assembly electrodes 121 and 122. The first electrode 134 may be formed of a conductive material, for example, a transparent conductive material such as indium tin oxide (ITO) and indium zinc oxide (IZO), or an opaque conductive material such as titanium (Ti), gold (Au), silver (Ag), copper (Cu), and indium (In) or an alloy thereof, but the present disclosure is not limited thereto.

The second electrode 135 is disposed on an upper surface of the second semiconductor layer 133. The second electrode 135 is an electrode that electrically connects the pixel electrode PE, which will be described later, and the second semiconductor layer 133. The second electrode 135 may be formed of a conductive material, for example, a transparent conductive material such as indium tin oxide (ITO) and indium zinc oxide (IZO), but is not limited thereto.

The magnetic layer 136 is disposed between the first electrode 134 and the first semiconductor layer 131. The magnetic layer 136 serves to move the light emitting element 130 in a direction of the assembly electrodes 121 and 122 during self-assembling of the light emitting element 130. That is, the magnetic layer 136 may serve to align a direction of the light emitting element 130 during a self-assembling process. The light emitting element 130 may be moved so that a region thereof where the magnetic layer 136 is disposed is adjacent to the assembly electrodes 121 and 122 by the magnetic layer 136. The magnetic layer 136 may be formed of any one of nickel (Ni), iron (Fe), molybdenum (Mo), and cobalt (Co) or an alloy thereof, but the present disclosure is not limited thereto.

The encapsulation layer 137 surrounding at least a portion of the first semiconductor layer 131, the light emitting layer 132, the second semiconductor layer 133, and the first electrode 134 is disposed. The encapsulation layer 137 may be formed of an insulating material and may protect the first semiconductor layer 131, the light emitting layer 132, and the second semiconductor layer 133. The encapsulation layer 137 may be disposed to cover side surfaces of the first semiconductor layer 131, the light emitting layer 132, and the second semiconductor layer 133. The first electrode 134 and the second electrode 135 may be exposed from the encapsulation layer 137, so that the pixel electrode PE and a connection electrode CCE, which will be formed later, and the first electrode 134 and the second electrode 135 may be electrically connected.

The light emitting element 130 may be configured as a vertical type light emitting element in which the first electrode 134, the magnetic layer 136, the first semiconductor layer 131, the light emitting layer 132, the second semiconductor layer 133, and the second electrode 135 are stacked in sequence. The light emitting element 130 may have a cross-sectional area increasing from one side thereof where the magnetic layer 136 is disposed to an opposite site thereof. In other words, the light emitting element 130 may have a cross-sectional width increasing from one side thereof where the magnetic layer 136 is disposed to the opposite side thereof.

An adhesive layer AD may be disposed between the plurality of light emitting elements 130 and the third passivation layer 117. The adhesive layer AD may be an organic film temporarily fixing the light emitting elements 130 during self-assembling of the light emitting elements 130. In manufacturing the display device 100, when an organic film covering the light emitting element 130 is formed, a portion of the organic film may fill a space between the light emitting elements 130 and the third passivation layer 117 to temporarily fix the light emitting elements 130 on the third passivation layer 117. Thereafter, even if the organic film is removed, a portion of the organic film permeated under the light emitting element 130 may remain without being removed and become the adhesive layer. The adhesive layer AD may be formed of an organic material, for example, an acryl-based organic material, but is not limited thereto.

The connection electrode CCE is disposed on a lower side surface of the light emitting element 130 and the first assembly electrode 121 and the second assembly electrode 122. Referring to FIG. 4, the connection electrode CCE is disposed on a side surface of the first electrode 134 exposed by the encapsulation layer 137, a portion of a side surface of the encapsulation layer 137 adjacent to the first electrode 134, and the respective cladding layers 121*b* and 122*b* of the first assembly electrode 121 and the second assembly electrode 122 exposed from the third passivation layer 117.

The connection electrode CCE is an electrode for electrically connecting the light emitting element 130 with the first assembly electrode 121 and the second assembly electrode 122. Accordingly, the connection electrode CCE electrically connects the first electrode 134 of the light emitting element 130 with the first assembly electrode 121 and the second assembly electrode 122.

Next, the second planarization layer 118 is disposed on the light emitting element 130 and the connection electrode CCE. The second planarization layer 118 may planarize an upper portion of the substrate 110 on which the light emitting element 130 is disposed, and may fix the light emitting element 130 onto the substrate 110 together with the adhesive layer AD. The second planarization layer 118 may be composed of a single layer or multiple layers, and may be formed of, for example, an acryl-based organic material, but is not limited thereto.

The fourth passivation layer 119 is disposed on the second planarization layer 118. The fourth passivation layer 119 is an insulating layer for protecting components under the fourth passivation layer 119, and may be composed of a single layer or multiple layers of silicon oxide (SiOx) or silicon nitride (SiNx), but is limited thereto. In this case, the fourth passivation layer 119 is not an essential component and may be omitted according to design.

The pixel electrode PE is disposed on the fourth passivation layer 119.

The pixel electrode PE is an electrode for electrically connecting the plurality of light emitting elements 130 and the connection unit 150. The pixel electrode PE is electrically connected to the plurality of light emitting elements 130. Specifically, the pixel electrode PE may be electrically connected to the light emitting elements 130, the connection unit 150, and the second transistor T2 through a contact hole formed in the second planarization layer 118 and the fourth passivation layer 119. Accordingly, the second electrode 135 of the light emitting element 130, the connection unit 150, and the second source electrode SE2 of the second transistor T2 may be electrically connected to each other through the pixel electrode PE. The pixel electrode PE may be formed of a conductive material, for example, a transparent conductive material such as indium tin oxide (ITO) or indium zinc oxide (IZO), but is not limited thereto.

In a process of self-assembling micro-LEDs, an organic layer including pocket portions in which the micro-LEDs are assembled are disposed above assembly electrodes. The organic layer may be removed after self-assembling is complete. In general, the pocket portion of the organic layer is formed to have a width increasing as it is away from the assembly electrode due to process characteristics. Meanwhile, the micro-LED includes a magnetic material to align a self-assembling direction. The micro-LED may be assembled such that a region thereof where the magnetic material is disposed is adjacent to the assembly electrode. In addition, a general micro-LED may be formed so that a side thereof on which a magnetic material is disposed has a larger area than that of an opposite side thereof. Accordingly, a direction in which a cross-sectional width of the pocket portion in which the micro-LED is assembled increases and a direction in which a cross-sectional width of the micro-LED increases may be opposite to each other. Therefore, friction may occur between the micro-LED and an inner sidewall of the pocket portion during self-assembling.

The light emitting element 130 according to an exemplary aspect of the present disclosure may be disposed such that the cross-sectional area thereof increases from one side thereof where the magnetic layer 136 is disposed to the opposite site thereof. Accordingly, a cross-sectional width of a pocket portion where the light emitting element 130 is assembled and the cross-sectional width of the light emitting element 130 may increase in the same direction during the self-assembling process. In addition, the light emitting element 130 may be self-assembled such that a portion thereof where the magnetic layer 136 having a relatively small area is disposed enters an inside of the pocket portion, first. Therefore, self-assembling of the light emitting element 130 may be performed more stably.

Figure 5:
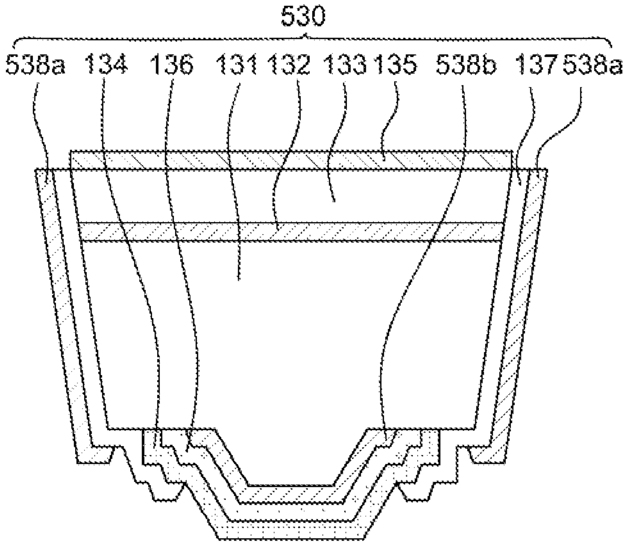
FIG. 5 is a cross-sectional view of a light emitting element according to another exemplary aspect of the present disclosure.

FIG. 5 is a cross-sectional view of a light emitting element according to another exemplary aspect of the present disclosure. Although only a light emitting element 530 is illustrated in FIG. 5, the light emitting element 530 may be self-assembled in the display device as illustrated in FIGS. 2 and 4. Since other configurations of the light emitting element 530 of FIG. 5 are substantially identical to those of the light emitting element 130 of FIG. 3 except for differences in terms of a first reflective layer 538*a* and a second reflective layer 538*b*, redundant descriptions thereof will be omitted.

Referring to FIG. 5, the light emitting element 530 includes the first semiconductor layer 131, the light emitting layer 132, the second semiconductor layer 133, the first electrode 134, the second electrode 135, the magnetic layer 136, the encapsulation layer 137, the first reflective layer 538*a*, and the second reflective layer 538*b*.

The first reflective layer 538*a* is disposed on the side surface of the encapsulation layer 137. That is, the first reflective layer 538*a* may cover a portion of the encapsulation layer 137 and may be disposed to surround the side surfaces of the first semiconductor layer 131, the light emitting layer 132, and the second semiconductor layer 133. The second reflective layer 538*b* is disposed between the magnetic layer 136 and the first semiconductor layer 131. In this case, the second reflective layer 538*b* may be formed of a material having a higher reflectance than the magnetic layer 136. Meanwhile, the second reflective layer 538*b* may be omitted in some cases. For example, when the magnetic layer 136 is formed of a material with high reflectance, the second reflective layer 538*b* may be omitted.

The first reflective layer 538*a* and the second reflective layer 538*b* may be formed of a conductive material having excellent reflective properties. For example, the first reflective layer 538*a* and the second reflective layer 538*b* may be formed of aluminum (Al), but are not limited thereto.

The light emitting element 530 according to another exemplary aspect of the present disclosure includes the first reflective layer 538*a* covering the encapsulation layer 137. In particular, the first reflective layer 538*a* may be disposed to surround the side surfaces of the first semiconductor layer 131, the light emitting layer 132, and the second semiconductor layer 133. Accordingly, light directed toward a side portion of the light emitting element 530 among light emitted from the light emitting layer 132 may be reflected by the first reflective layer 538*a* and extracted to the outside.

The light emitting element 530 is configured to have a cross-sectional area increasing from one side thereof where the magnetic layer 136 is disposed to an opposite side thereof. That is, the light emitting element 530 may be formed to be inclined toward an outside of the light emitting element 530 in a direction from the first electrode 134 to the second electrode 135. Accordingly, the first reflective layer 538*a* may also be formed to be inclined toward the outside of the light emitting element 530 in the direction from the first electrode 134 to the second electrode 135. Accordingly, a traveling path of light that is reflected by the first reflective layer 538*a* may be configured to be directed toward the second electrode 135. Accordingly, light extraction efficiency of the light emitting element 530 may be improved.

The light emitting element 530 according to another exemplary aspect of the present disclosure further includes the second reflective layer 538*b* between the magnetic layer 136 and the first semiconductor layer 131. Accordingly, light directed toward a lower portion of the light emitting element 530 among the light emitted from the light emitting layer 132 may be reflected by the second reflective layer 538*b* and extracted to the outside. In particular, the magnetic layer 136 and the first electrode 134 of the light emitting element 530 may be disposed at an opposite side of a direction in which light is extracted, and may be formed of a relatively opaque material or a material having low reflectance. Accordingly, in the present disclosure, by disposing the second reflective layer 538*b* on the magnetic layer 136, the amount of light extracted to the outside may be increased.

In particular, the first reflective layer 538*a* and the second reflective layer 538*b* are disposed to surround a majority of an area of the light emitting element 530 except for a region where the second electrode 135 from which light is extracted is disposed. Accordingly, light directed toward an inside of the light emitting element 530 is reflected by the first reflective layer 538*a* and the second reflective layer 538*b* and may be extracted to the outside. Accordingly, light efficiency of the light emitting element 530 and a display device including the light emitting element 530 may be increased.

The light emitting element 530 according to another exemplary aspect of the present disclosure includes the first reflective layer 538*a* and the second reflective layer 538*b*. Accordingly, to improve light efficiency in the display device, a reflector that is disposed below the light emitting element 530 may be omitted. Accordingly, a manufacturing process of the display device may be further simplified. In addition, non-uniformity in luminance due to an assembly tolerance of the light emitting element 530 may be improved. Specifically, when a deviation occurs in positions of the reflector and the light emitting element 530, areas of reflective layers located on one side and the other side of the light emitting element 530 may be varied, which may cause non-uniformity in luminance and luminance deviation. Accordingly, the light emitting element 530 according to another exemplary aspect of the present disclosure is configured to allow for omission of the reflector in the display device, so that non-uniformity in luminance may be prevented and display quality may be improved.

Figure 6A:
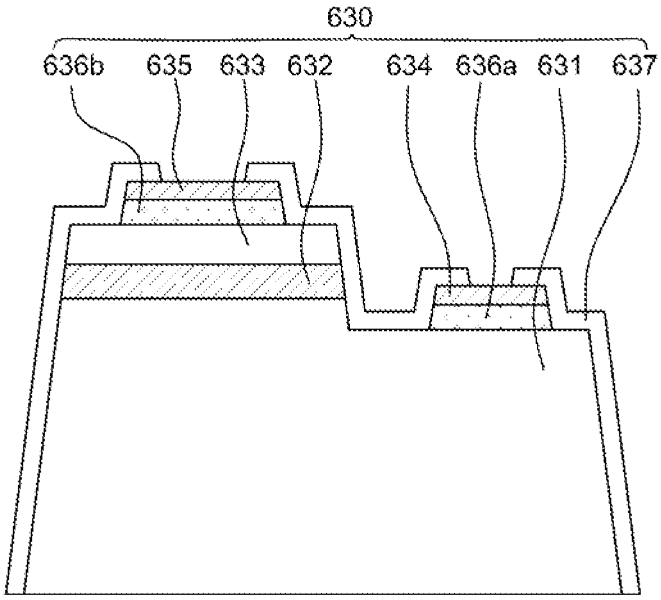
FIG. 6A is a cross-sectional view of a light emitting element according to still another exemplary aspect of the present disclosure.
Figure 6B:
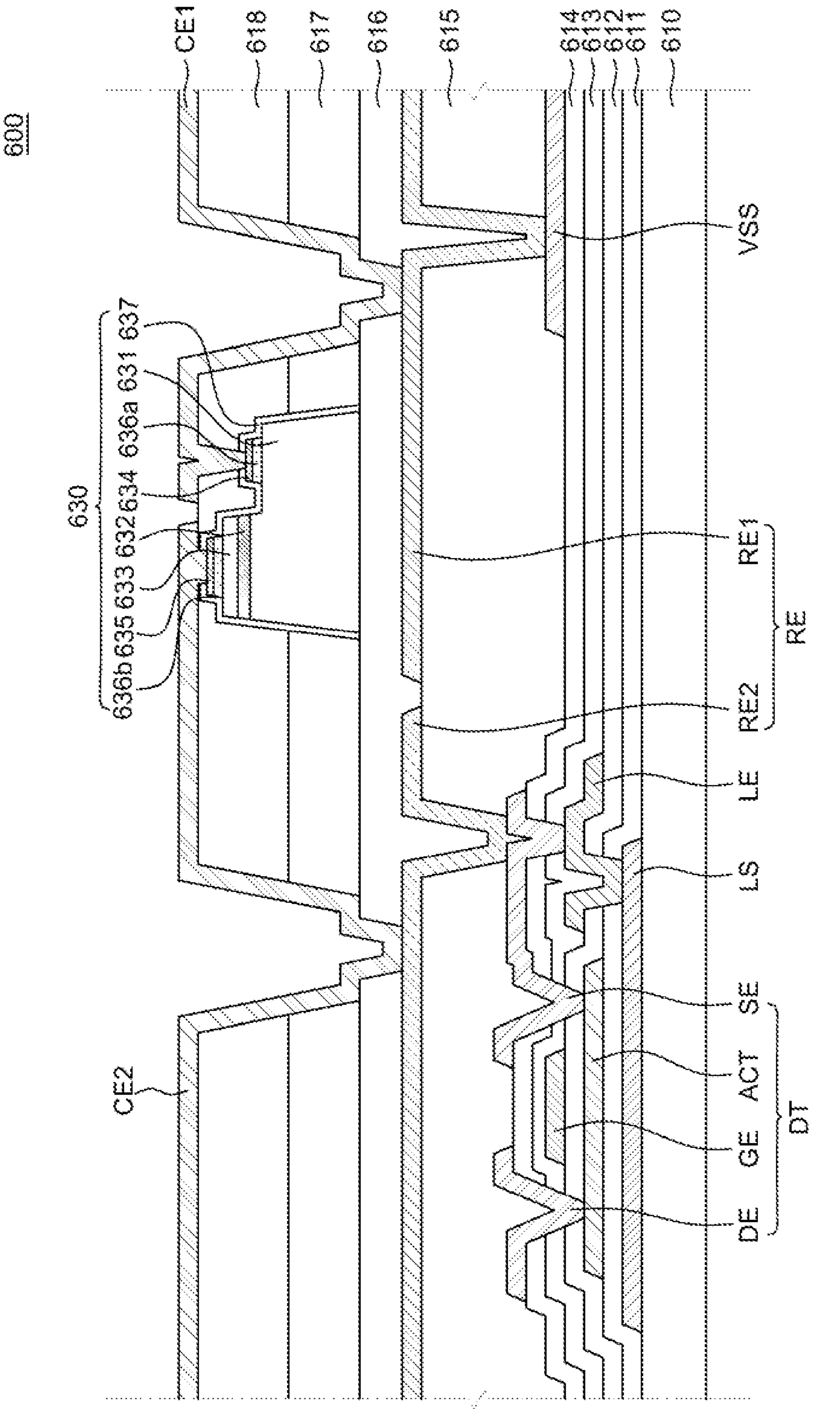
FIG. 6B is a cross-sectional view of a display device according to still another exemplary aspect of the present disclosure.

FIG. 6A is a cross-sectional view of a light emitting element according to still another exemplary aspect of the present disclosure. FIG. 6B is a cross-sectional view of a display device according to still another exemplary aspect of the present disclosure. FIG. 6B may be a cross-sectional view corresponding to a sub-pixel SP of a display device 600. In FIG. 6B, only a light shielding layer LS, a driving transistor DT, reflective electrodes RE, a low potential power supply line VSS, a light emitting element 630, and connection electrodes CE1 and CE2 among components of the sub-pixel SP are illustrated for convenience of description.

Referring to FIGS. 6A and 6B, the display device 600 includes a substrate 610, a buffer layer 611, a gate insulating layer 612, a first interlayer insulating layer 613, a second interlayer insulating layer 614, a first planarization layer 615, an adhesive layer 616, a second planarization layer 617, a third planarization layer 618, the driving transistor DT, the light emitting element 630, a plurality of the reflective electrodes RE, the connection electrodes CE1 and CE2, the light shielding layer LS, and an auxiliary electrode LE.

The substrate 610 is a component to support various components included in the display device 600 and may be formed of an insulating material. For example, the substrate 610 may be formed of glass, resin or the like. In addition, the substrate 610 may be formed to include a polymer or plastic, or may be formed of a material having flexibility.

The light shielding layer LS is disposed in each of a plurality of sub-pixels SP on the substrate 610. The light shielding layer LS blocks light incident from a lower portion of the substrate 610 into an active layer ACT of the driving transistor DT, which will be described later. The light which is incident into the active layer ACT of the driving transistor DT may be blocked by the light shielding layer LS, so that leakage current may be minimized.

The buffer layer 611 is disposed on the substrate 610 and the light shielding layer LS. The buffer layer 611 may reduce penetration of moisture or impurities through the substrate 610. The buffer layer 611 may be composed of, for example, a single layer or multiple layers of silicon oxide (SiOx) or silicon nitride (SiNx), but is not limited thereto. However, the buffer layer 611 may be omitted depending on a type of the substrate 610 or a type of transistor, but is not limited thereto.

The driving transistor DT is disposed on the buffer layer 611. The driving transistor DT includes the active layer ACT, a gate electrode GE, a source electrode SE, and a drain electrode DE. The driving transistor DT may refer to the second transistor T2 of FIG. 4.

The active layer ACT is disposed on the buffer layer 611. The active layer ACT may be formed of a semiconductor material such as oxide semiconductor, amorphous silicon, or polysilicon, but is not limited thereto.

The gate insulating layer 612 is disposed on the active layer ACT. The gate insulating layer 612 is an insulating layer for insulating the active layer ACT and the gate electrode GE, and may be composed of a single layer or multiple layers of silicon oxide (SiOx) or silicon nitride (SiNx), but is limited thereto.

The gate electrode GE is disposed on the gate insulating layer 612. The gate electrode GE may be formed of a conductive material such as copper (Cu), aluminum (Al), molybdenum (Mo), nickel (Ni), titanium (Ti), chromium (Cr), or an alloy thereof, but is not limited thereto.

The first interlayer insulating layer 613 and the second interlayer insulating layer 614 are disposed on the gate electrode GE. Contact holes for connecting each of the source electrode SE and the drain electrode DE to the active layer ACT are formed in the first interlayer insulating layer 613 and the second interlayer insulating layer 614. The first interlayer insulating layer 613 and the second interlayer insulating layer 614 are insulating layers for protecting components under the first interlayer insulating layer 613 and the second interlayer insulating layer 614, and may be composed of a single layer or multiple layers of silicon oxide (SiOx) or silicon nitride (SiNx), but the present disclosure is limited thereto.

The source electrode SE and the drain electrode DE electrically connected to the active layer ACT are disposed on the second interlayer insulating layer 614. The source electrode SE and the drain electrode DE may be formed of a conductive material such as copper (Cu), aluminum (Al), molybdenum (Mo), nickel (Ni), titanium (Ti), chromium (Cr), or an alloy for, but are not limited thereto.

Meanwhile, in the present disclosure, it is described that the first interlayer insulating layer 613 and the second interlayer insulating layer 614, that is, a plurality of insulating layers are disposed between the gate electrode GE, and the source electrode SE and the drain electrode DE. However, only one insulating layer may be disposed between the gate electrode GE, and the source electrode SE and the drain electrode DE, but the present disclosure is not limited thereto.

As illustrated in the drawings, when a plurality of insulating layers such as the first interlayer insulating layer 613 and the second interlayer insulating layer 614 are disposed between the gate electrode GE, and the source electrode SE and the drain electrode DE, an electrode may be additionally formed between the first interlayer insulating layer 613 and the second interlayer insulating layer 614, and the additionally formed electrode may form a capacitor with other components disposed on a lower portion of the first interlayer insulating layer 613 or an upper portion of the second interlayer insulating layer 614.

The auxiliary electrode LE is disposed on the gate insulating layer 612. The auxiliary electrode LE is an electrode electrically connecting the light shielding layer LS under the buffer layer 611 to one of the source electrode SE and the drain electrode DE on the second interlayer insulating layer 614. For example, since the light shielding layer LS is electrically connected to either the source electrode SE or the drain electrode DE through the auxiliary electrode LE and does not operate as a floating gate, so that a variance in threshold voltage of the driving transistor DT which is generated by the light shielding layer LS that is floating may be minimized. Although the light shielding layer LS is illustrated as being connected to the source electrode SE in the drawings, the light shielding layer LS may be connected to the drain electrode DE, but is not limited thereto.

The low potential power supply line VSS is disposed on the second interlayer insulating layer 614. The low potential power supply line VSS is a line that transmits a low potential power supply voltage to each of the plurality of sub-pixels SP. The low potential power supply line VSS, along with the driving transistor DT, may be electrically connected to the light emitting element 630 to emit the light emitting element 630. The low potential power supply line VSS may be formed of a conductive material such as copper (Cu), aluminum (Al), molybdenum (Mo), nickel (Ni), titanium (Ti), chromium (Cr) or an alloy thereof, but is not limited thereto.

The first planarization layer 615 is disposed on the driving transistor DT and the low potential power supply line VSS. The first planarization layer 615 may planarize an upper portion of the substrate 610 on which the driving transistor DT is disposed. The first planarization layer 615 may be composed of a single layer or multiple layers, and may be formed of, for example, photoresist or an acryl-based organic material, but the present disclosure is not limited thereto.

The plurality of reflective electrodes RE are disposed on the first planarization layer 615 to be spaced apart from each other. The plurality of reflective electrodes RE may electrically connect the light emitting element 630 and the low potential power supply line VSS and the driving transistor DT, and at the same time, may function as a lower reflective layer that reflects light emitted from the light emitting element 630 toward an upper portion of the light emitting element 630. The plurality of reflective electrodes RE may be formed of a conductive material having excellent reflective properties, and may reflect light emitted from the light emitting element 630 toward an upper portion of the light emitting element 630.

The plurality of reflective electrodes RE includes a first reflective electrode RE1 and a second reflective electrode RE2.

The first reflective electrode RE1 may electrically connect the low potential power supply line VSS and the light emitting element 630. The first reflective electrode RE1 may be connected to the low potential power supply line VSS through a contact hole formed in the first planarization layer 615, and may be electrically connected to a first electrode 634 and a first semiconductor layer 631 of the light emitting element 630 through a first connection electrode CE1 which will be described later.

The second reflective electrode RE2 may electrically connect the driving transistor DT and the light emitting element 630. The second reflective electrode RE2 may be connected to the source electrode SE or the drain electrode DE of the driving transistor DT through a contact hole formed in the first planarization layer 615. Also, the second reflective electrode RE2 may be electrically connected to a second electrode 635 and a second semiconductor layer 633 of the light emitting element 630 through a second connection electrode CE2, which will be described later.

The adhesive layer 616 is disposed on the plurality of reflective electrodes RE. The adhesive layer 616 may be coated on an entire surface of the substrate 610 to fix the light emitting element 630 disposed on the adhesive layer 616. The adhesive layer 616 may be one selected from among, for example, adhesive polymer, epoxy resist, UV resin, polyimides, acrylates, urethanes, and polydimethylsiloxane (PDMS), but is not limited thereto.

A plurality of light emitting elements 630 are disposed on the adhesive layer 616 in each of the plurality of sub-pixels SP. The plurality of light emitting elements 630 are elements emitting light by current, and may include light emitting elements 630 emitting red light, green light, blue light, and the like, and through a combination thereof, may implement light of various colors including white. For example, the plurality of light emitting elements 630 may be light emitting diodes (LEDs) or micro-LEDs, but are not limited thereto.

The light emitting element 630 includes the first semiconductor layer 631, the light emitting layer 632, the second semiconductor layer 633, the first electrode 634, the second electrode 635, magnetic layers 636*a* and 636*b*, and an encapsulation layer 637.

The first semiconductor layer 631 is disposed on the adhesive layer 616, and the second semiconductor layer 633 is disposed on the first semiconductor layer 631. The first semiconductor layer 631 and the second semiconductor layer 633 may be layers formed by doping a specific material with n-type impurities and p-type impurities. For example, each of the first semiconductor layer 631 and the second semiconductor layer 633 may be layers formed by doping materials such as gallium nitride (GaN), indium aluminum phosphide (InAlP), gallium arsenide (GaAs), and the like, with n-type impurities or p-type impurities. In addition, the p-type impurity may be magnesium (Mg), zinc (Zn), beryllium (Be) or the like, and the n-type impurity may be silicon (Si), germanium (Ge), tin (Sn) or the like, but the present disclosure is not limited thereto.

The light emitting layer 632 is disposed between the first semiconductor layer 631 and the second semiconductor layer 633. The light emitting layer 632 may receive holes and electrons from the first semiconductor layer 631 and the second semiconductor layer 633 to emit light. The light emitting layer 632 may be formed of a single or multi-quantum well (MQW) structure, and may be formed of, for example, indium gallium nitride (InGaN) or gallium nitride (GaN), but the present disclosure is not limited thereto.

The first electrode 634 is disposed on the first semiconductor layer 631. The first electrode 634 is an electrode for electrically connecting the first semiconductor layer 631 and the low potential power supply line VSS. The first electrode 634 may be formed of a conductive material, for example, a transparent conductive material such as indium tin oxide (ITO) or indium zinc oxide (IZO), or an opaque conductive material such as titanium (Ti), gold (Au), silver (Ag), copper (Cu), indium (In) or an alloy thereof, but the present disclosure is not limited thereto.

The second electrode 635 is disposed on the second semiconductor layer 633. The second electrode 635 is an electrode that electrically connects the second semiconductor layer 633 and the driving transistor DT. The second electrode 635 may be formed of a conductive material, for example, a transparent conductive material such as indium tin oxide (ITO) or indium zinc oxide (IZO), or an opaque conductive material such as titanium (Ti), gold (Au), silver (Ag), copper (Cu), indium (In) or an alloy thereof, but the present disclosure is not limited thereto.

The magnetic layers 636*a* and 636*b* include a first magnetic layer 636*a* and a second magnetic layer 636*b*. The first magnetic layer 636*a* is disposed between the first electrode 634 and the first semiconductor layer 631. The second magnetic layer 636*b* is disposed between the second electrode 635 and the second semiconductor layer 633. The magnetic layers 636*a* and 636*b* may serve to align a direction of the light emitting element 630 during a self-assembling process of the light emitting element 630. The light emitting element 630 may be self-aligned such that a region thereof where the magnetic layers 636*a* and 636*b* are disposed faces an assembly substrate 10 to be described later. In addition, the light emitting element 630 may be transferred so that an opposite side of the region where the magnetic layers 636*a* and 636*b* are disposed is disposed on the adhesive layer 616. The magnetic layer 636 may be formed of any one of nickel (Ni), iron (Fe), molybdenum (Mo), and cobalt (Co) or an alloy thereof, but is not limited thereto. Meanwhile, a self-assembling process of the light emitting element 630 will be described later with reference to FIGS. 7A to 7C.

The encapsulation layer 637 surrounding at least a portion of the first semiconductor layer 631, the light emitting layer 632, the second semiconductor layer 633, the first electrode 634, the second electrode 635, and the magnetic layers 636*a* and 636*b* is disposed. The encapsulation layer 637 is formed of an insulating material and may protect the first semiconductor layer 631, the light emitting layer 632, and the second semiconductor layer 633. The encapsulation layer 637 may be disposed to cover side surfaces of the first semiconductor layer 631, the light emitting layer 632, and the second semiconductor layer 633. In addition, the encapsulation layer 637 may be disposed to cover portions of upper surfaces of the first semiconductor layer 631 and the second semiconductor layer 633. The first electrode 634 and the second electrode 635 may be exposed from the encapsulation layer 637, so that the connection electrodes CE1 and CE2, which will be formed later, and the first electrode 634 and the second electrode 635 may be electrically connected.

The light emitting element 630 is configured to include one first electrode 634, one first magnetic layer 636*a*, one second electrode 635, and one second magnetic layer 636*b*. The light emitting element 630 may be configured as a lateral type light emitting element in which the first magnetic layer 636*a* and the first electrode 634 are disposed on a portion of the first semiconductor layer 631, and the second magnetic layer 636*b* and the second electrode 635 are disposed on another portion of the first semiconductor layer 631. A cross-sectional area of the light emitting element 630 may increase from one side thereof where the magnetic layers 636*a* and 636*b* are disposed to an opposite side thereof. In other words, the light emitting element 630 may have a cross-sectional width increasing from one side thereof where the magnetic layers 636*a* and 636*b* are disposed to the opposite side thereof.

Meanwhile, the light emitting element 630 may further include a reflective layer. The reflective layer may be disposed to cover a portion of the encapsulation layer 637 and to surround at least a side surface of the first semiconductor layer 631. The reflective layer may be formed of a conductive material having excellent reflective properties. When the light emitting element 630 includes the reflective layer, the amount of light extracted to the outside of the light emitting element 630 may increase, and light efficiency of the display device 600 may increase.

The second planarization layer 617 and the third planarization layer 618 are disposed on the adhesive layer 616. The second planarization layer 617 may overlap a portion of a side surface of the light emitting element 630 to fix and protect the plurality of light emitting elements 630. The third planarization layer 618 is formed to cover an upper portion of the light emitting element 630 and the second planarization layer 617, but may have contact holes through which the first electrode 634 and the second electrode 635 of the light emitting element 630 are exposed. The first electrode 634 and the second electrode 635 of the light emitting element 630 are exposed from the third planarization layer 618, and the third planarization layer 618 may be partially disposed in a region between the first electrode 634 and the second electrode 635 to thereby minimize short circuit defects. The second planarization layer 617 and the third planarization layer 618 may be composed of a single layer or multiple layers, and may be formed of, for example, photoresist or an acryl-based organic material, but are not limited thereto. Meanwhile, in the present disclosure, it has been described that the second planarization layer 617 and the third planarization layer 618 are disposed, but the planarization layers may be formed as a single layer, and the present disclosure is not limited thereto.

The connection electrodes CE1 and CE2 are disposed on the third planarization layer 618. The connection electrodes CE1 and CE2 include a first connection electrode CE1 and a second connection electrode CE2.

The first connection electrode CE1 is an electrode for electrically connecting the light emitting element 630 and the low potential power supply line VSS. The first connection electrode CE1 may be connected to the first reflective electrode RE1 through a contact hole formed in the third planarization layer 618, the second planarization layer 617, and the adhesive layer 616. Accordingly, the first connection electrode CE1 may be electrically connected to the low potential power supply line VSS through the first reflective electrode RE1. Also, the first connection electrode CE1 may be connected to the first electrode 634 of the light emitting element 630 through a contact hole formed in the third planarization layer 618. Accordingly, the first connection electrode CE1 may electrically connect the low potential power supply line VSS with the first electrode 634 and the first semiconductor layer 631 of the light emitting element 630.

The second connection electrode CE2 is an electrode for electrically connecting the light emitting element 630 and the driving transistor DT. The second connection electrode CE2 may be connected to the second reflective electrode RE2 through a contact hole formed in the third planarization layer 618, the second planarization layer 617, and the adhesive layer 616. Accordingly, the second connection electrode CE2 may be electrically connected to one of the source electrode SE and the drain electrode DE of the driving transistor DT through the second reflective electrode RE2. The second connection electrode CE2 may be connected to the second electrode 635 of the light emitting element 630 through the contact hole formed in the third planarization layer 618. Accordingly, the second connection electrode CE2 may electrically connect the driving transistor DT with the second electrode 635 and the second semiconductor layer 633 of the light emitting element 630.

Meanwhile, the second connection electrode CE2 connecting the light emitting element 630 and the driving transistor DT disposed in each of the plurality of sub-pixels SP may be individually disposed in each of the plurality of sub-pixels SP. Also, the first connection electrodes CE1 disposed in each of the plurality of sub-pixels SP and connecting the low potential power supply lines VSS and the light emitting elements 630 may be connected to each other. That is, since a low potential power supply voltage of the low potential power supply line VSS is applied to all of the plurality of light emitting elements 630 of the plurality of sub pixels SP in common, one connection electrode CE1 may be disposed in an entirety of the plurality of sub pixels SP.

Figure 7A:
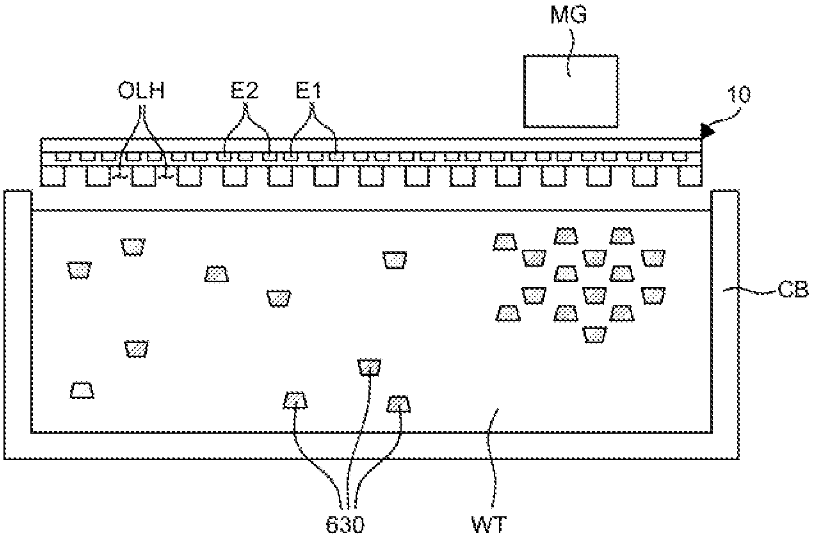
FIGS. 7A to 7C are cross-sectional views illustrating self-assembling of light emitting elements according to still another exemplary aspect of the present disclosure.
Figure 7B:
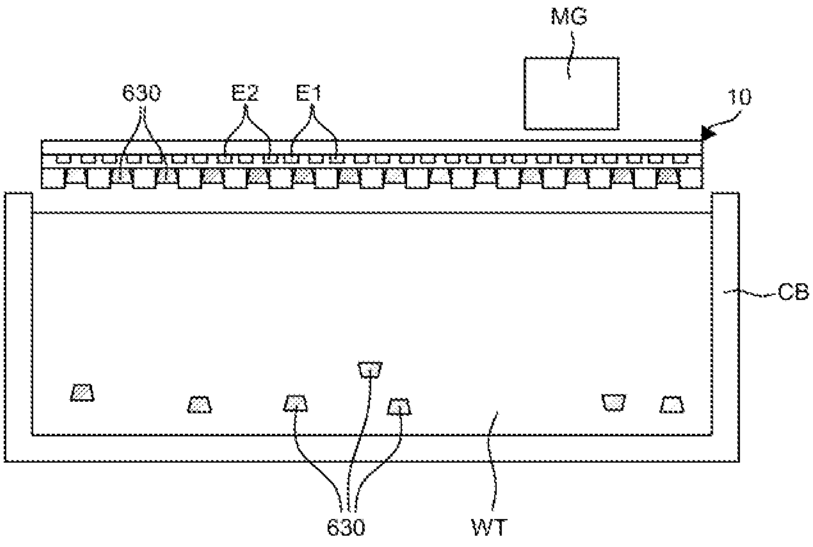
Figure 7C:
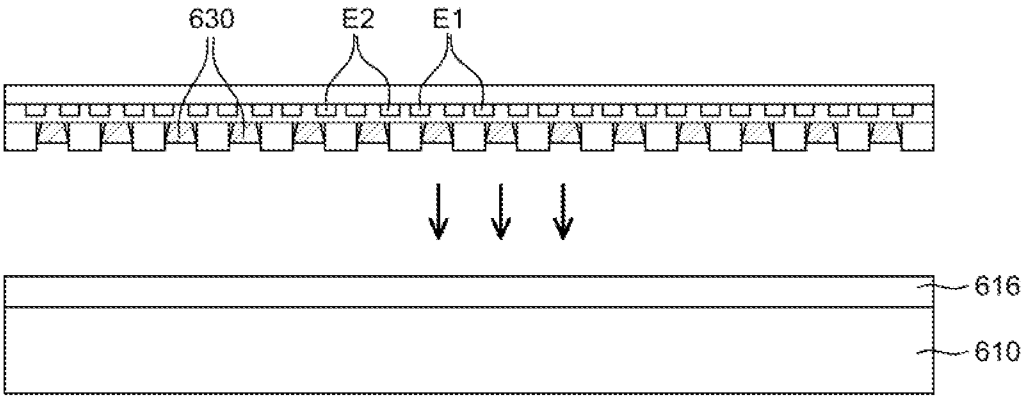

FIGS. 7A to 7C are cross-sectional views illustrating self-assembling of light emitting elements according to still another exemplary aspect of the present disclosure.

Referring to FIG. 7A, the light emitting elements 630 may be transferred to the assembly substrate 10 in a self-assembling method.

First, the plurality of light emitting elements 630 grown on a wafer are put into a chamber CB filled with a fluid WT. The fluid WT may include water or the like, and the chamber CB filled with the fluid WT may have an open top.

Next, the assembly substrate 10 may be positioned on the chamber CB filled with the light emitting elements 630. The assembly substrate 10 is a substrate on which the light emitting elements 630 are temporarily self-assembled. After the light emitting elements 630 are self-assembled on the assembly substrate 10, the light emitting elements 630 on the assembly substrate 10 may be transferred to the display device 600.

Next, a magnet MG may be positioned on the assembly substrate 10. The light emitting elements 630 sinking in or floating on a bottom of the chamber CB may move toward the assembly substrate 10 by a magnetic force of the magnet MG. Specifically, since the light emitting element 630 includes the magnetic layers 636*a* and 636*b*, the light emitting element 630 may move in a direction of the assembly substrate 10 by a magnetic field. In this case, the light emitting element 630 may be aligned so that a region thereof where the magnetic layers 636*a* and 636*b* are disposed faces the assembly substrate 10 by the magnetic layers 636*a* and 636*b*.

Next, referring to FIG. 7B, the light emitting element 630 moved toward the assembly substrate 10 by the magnet MG may be self-assembled on the assembly substrate 10.

The assembly substrate 10 includes a plurality of pocket portions OLH and a plurality of assembly electrodes E1 and E2. The plurality of pocket portions OLH may be regions in which the plurality of light emitting elements 630 are self-assembled. The plurality of assembly electrodes E1 and E2 include first electrodes E1 and second electrodes E2. The first electrodes E1 and the second electrodes E2 may be disposed on one sides and the other sides of the pocket portions OLH. The first electrodes E1 and the second electrodes E2 may be disposed adjacent to each other to form electric fields for self-assembling the light emitting elements 630. Accordingly, the light emitting elements 630 may be self-assembled in the pocket portions OLH of the assembly substrate 10 by electric fields formed by the first electrodes E1 and the second electrodes E2.

Specifically, an AC voltage may be applied to the first electrode E1 and the second electrode E2 to form an electric field. The light emitting element 630 may be dielectrically polarized by such an electric field and have a polarity. In addition, the dielectrically polarized light emitting element 630 may be moved in a specific direction or fixed by dielectrophoresis (DEP), that is, an electric field. Accordingly, the plurality of light emitting elements 630 may be temporarily self-assembled inside the pocket portions OLH of the assembly substrate 10 using dielectrophoresis.

Next, referring to FIG. 7C, the plurality of light emitting elements 630 on the assembly substrate 10 are transferred onto the adhesive layer 616 on the substrate 610.

First, the display device 600 in which the adhesive layer 116 is formed is aligned with the assembly substrate 10. In this case, the assembly substrate 10 and the display device 600 may be aligned so that the plurality of light emitting elements 630 on the assembly substrate 10 and the adhesive layer 116 of the display device 600 face each other. In addition, the plurality of light emitting elements 630 on the assembly substrate 10 may be transferred to the adhesive layer 116 through laser transfer. In this case, the plurality of light emitting elements 630 may be transferred through direct laser transfer of a flying type. That is, when the assembly substrate 10 is irradiated with laser, the plurality of light emitting elements 630 are separated from the assembly substrate 10, and the plurality of light emitting elements 630 may be transferred to the adhesive layer 116 facing the assembly substrate 10.

A typical hybrid self-aligning transfer process (HSAT) may be performed in two transfer processes. That is, micro-LEDs are self-assembled on an assembly substrate, the micro-LEDs on the assembly substrate are firstly transferred to a donor, and then, the donor's micro-LEDs are secondarily transferred onto an adhesive layer of a display device. Accordingly, a transfer tolerance may occur through the two transfer processes, which may cause misalignment in arrangement of the micro-LEDs, thereby resulting in short circuit defects and dark spots.

Accordingly, the display device 600 according to still another exemplary aspect of the present disclosure may allow for minimization of a transfer tolerance by performing a single transfer process. That is, after self-assembling the light emitting elements 630 on the assembly substrate 10, the light emitting elements 630 on the assembly substrate 10 may be directly transferred onto the adhesive layer 616 of the display device 600. Therefore, it is possible to minimize a transfer tolerance that may occur due to a plurality of transfer processes and improve quality of the display device 600.

The display device 600 according to still another exemplary aspect of the present disclosure may simplify a process through a reduction of a transfer process. Accordingly, process equipment and manufacturing costs may be reduced, and productivity may be improved. That is, the process of the display device 600 may be optimized.

The light emitting element 630 according to still another exemplary aspect of the present disclosure may be configured to have the cross-sectional area increasing from one side thereof where the magnetic layers 636*a* and 636*b* are disposed to the opposite side thereof. Accordingly, the light emitting element 630 may be self-assembled such that a portion thereof having a small area faces the assembly substrate 10. That is, the light emitting element 630 may be self-assembled such that a portion thereof where the magnetic layer 136 having a relatively small area is disposed enters the inside of the pocket portion OLH, first. Accordingly, when the light emitting element 630 is self-assembled, friction between the light emitting element 630 and the inner sidewall of the pocket portion OLH may be minimized. Therefore, self-assembling of the light emitting element 630 may be performed more stably.

In addition, the light emitting element 630 may be transferred so that a portion thereof having a relatively large area comes into contact with the adhesive layer 616. Thus, before forming the second planarization layer 617 and the third planarization layer 618, the light emitting element 630 may be stably fixed on the adhesive layer 616. Thus, process reliability may be improved.

In the light emitting element 630 according to still another exemplary aspect of the present disclosure, surfaces of the magnetic layers 636*a* and 636*b* and a surface of the first electrode 634 or the second electrode 635 in contact with the magnetic layer 636*a* or 636*b* may be configured to have an uneven portion. Specifically, the light emitting element 630 is configured such that the magnetic layers 636*a* and 636*b* are arranged in an emission direction. In this case, since the magnetic layers 636*a* and 636*b* are generally formed of a metal material having low transmittance, light emitting efficiency may decrease. Accordingly, the surfaces of the magnetic layers 636*a* and 636*b*, the surface of the first electrode 634, or the surface of the second electrode 635 may have an uneven portion, thereby increasing diffused reflection effects. Therefore, even if the magnetic layers 636*a* and 636*b* are disposed in the emission direction, a decrease in light efficiency of the light emitting element 630 may be prevented.

In addition, the light emitting element 630 may further include a reflective layer surrounding at least a side surface of the first semiconductor layer 631. When the light emitting element 630 includes the reflective layer, light extraction efficiency of the light emitting element 630 may be further increased.

Figure 8A:
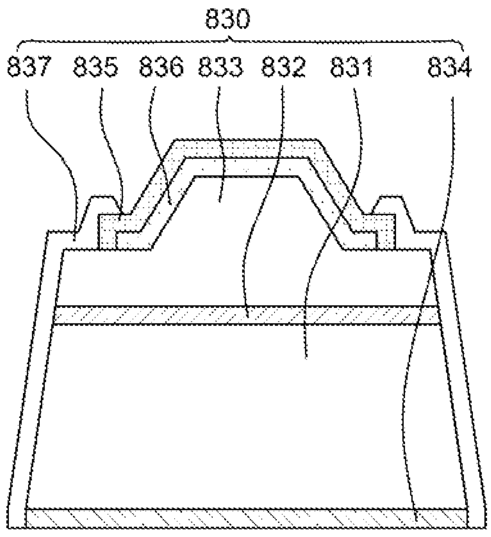
FIG. 8A is a cross-sectional view of a light emitting element according to still another exemplary aspect of the present disclosure.
Figure 8B:
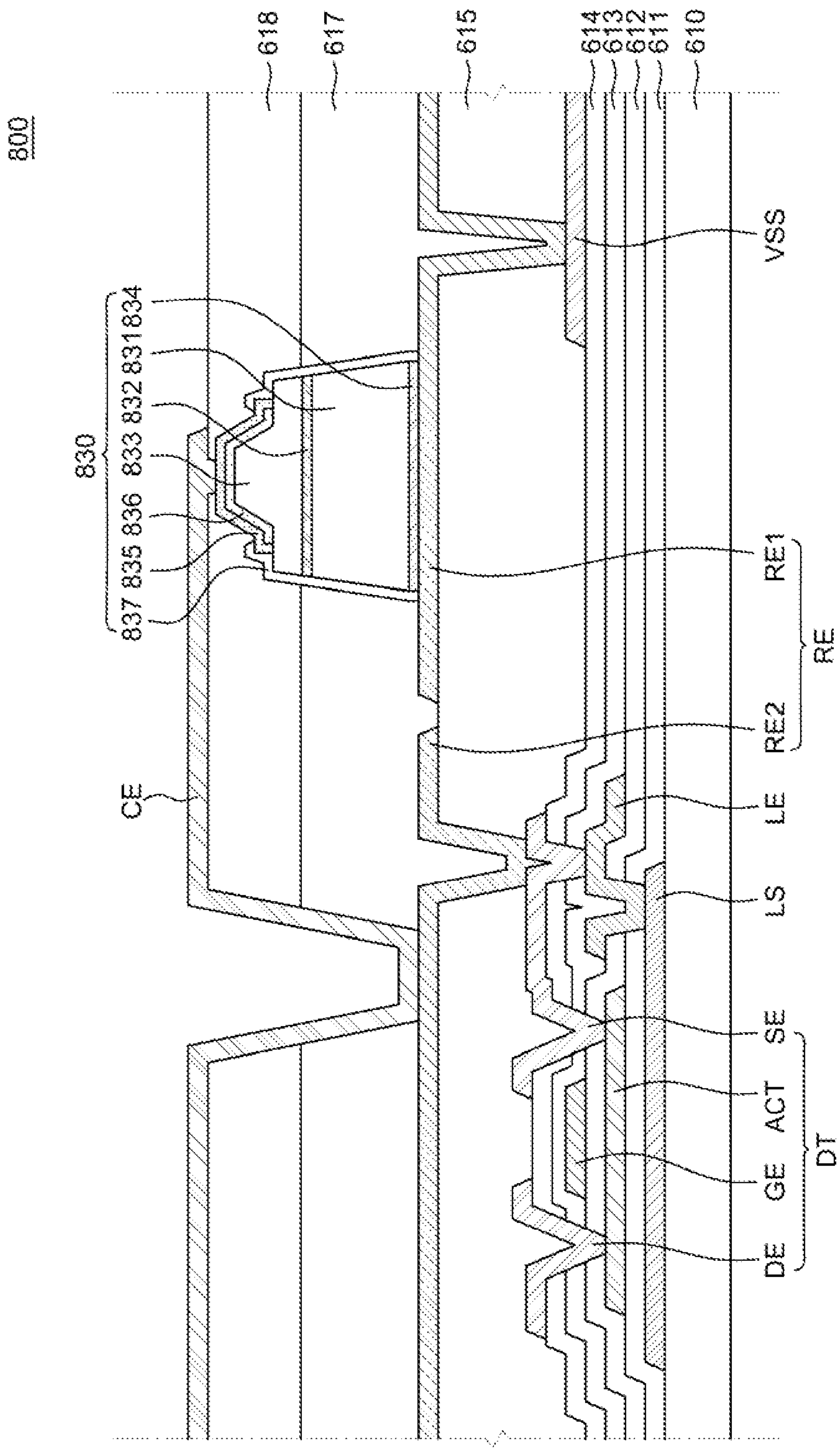
FIG. 8B is a cross-sectional view of a display device according to still another exemplary aspect of the present disclosure.

FIG. 8A is a cross-sectional view of a light emitting element according to still another exemplary aspect of the present disclosure. FIG. 8B is a cross-sectional view of a display device according to still another exemplary aspect of the present disclosure. Since other configurations of a display device 800 of FIGS. 8A and 8B are substantially identical to those of the display device 600 of FIGS. 6A and 6B except for differences in terms of a structure of a light emitting element 830 and a connection structure between the light emitting element 830 and the display device 800, redundant descriptions thereof will be omitted.

Referring to FIGS. 8A and 8B, the display device 800 includes the substrate 610, the buffer layer 611, the gate insulating layer 612, the first interlayer insulating layer 613, the second interlayer insulating layer 614, the first planarization layer 615, the second planarization layer 617, the third planarization layer 618, the driving transistor DT, the light emitting element 830, the plurality of reflective electrodes RE, the connection electrode CE, the light shielding layer LS, and the auxiliary electrode LE.

The light emitting element 830 is disposed on the first reflective electrode RE1. Since a first electrode 834 of the light emitting element 830 is disposed on the first reflective electrode RE1, the first electrode 834 may be electrically connected to the low potential power supply line VSS. Meanwhile, an adhesive layer may be disposed between the light emitting element 830 and the first reflective electrode RE1. For electrical connection between the first electrode 834 of the light emitting element 830 and the first reflective electrode RE1, the adhesive layer may be a conductive adhesive layer, but is not limited thereto.

The light emitting element 830 is an element that emits light by current. The light emitting elements 830 may include light emitting elements 830 that emit red light, green light, blue light, and the like, and through a combination thereof, may implement light of various colors including white. For example, the light emitting element 830 may be a light emitting diode (LED) or a micro-LED, but is not limited thereto.

The light emitting element 830 includes a first semiconductor layer 831, a light emitting layer 832, a second semiconductor layer 833, a first electrode 834, a second electrode 835, a magnetic layer 836, and an encapsulation layer 837.

The first semiconductor layer 831 is disposed on the first electrode 834, and the second semiconductor layer 833 is disposed on the first semiconductor layer 831. The first semiconductor layer 831 and the second semiconductor layer 833 may be layers formed by doping a specific material with n-type impurities and p-type impurities. For example, each of the first semiconductor layer 831 and the second semiconductor layer 833 may be layers formed by doping materials such as gallium nitride (GaN), indium aluminum phosphide (InAlP), gallium arsenide (GaAs), and the like, with n-type impurities or p-type impurities. In addition, the p-type impurity may be magnesium (Mg), zinc (Zn), beryllium (Be) or the like, and the n-type impurity may be silicon (Si), germanium (Ge), tin (Sn) or the like, but the present disclosure is not limited thereto.

The light emitting layer 832 is disposed between the first semiconductor layer 831 and the second semiconductor layer 833. The light emitting layer 832 may emit light by receiving holes and electrons from the first semiconductor layer 831 and the second semiconductor layer 833. The light emitting layer 832 may be formed of a single or multi-quantum well (MQW) structure, and may be formed of, for example, indium gallium nitride (InGaN) or gallium nitride (GaN), but is not limited thereto.

The first electrode 834 is disposed on a lower surface of the first semiconductor layer 831. The first electrode 834 is an electrode for electrically connecting the first semiconductor layer 831 and the low potential power supply line VSS. The first electrode 834 may be formed of a conductive material, for example, a transparent conductive material such as indium tin oxide (ITO) or indium zinc oxide (IZO), or an opaque conductive material such as titanium (Ti), gold (Au), silver (Ag), copper (Cu), indium (In) or an alloy thereof, but the present disclosure is not limited thereto.

The second electrode 835 is disposed on the second semiconductor layer 833. The second electrode 835 is an electrode that electrically connects the second semiconductor layer 833 and the driving transistor DT. The second electrode 835 may be formed of a conductive material, for example, a transparent conductive material such as indium tin oxide (ITO) or indium zinc oxide (IZO), or an opaque conductive material such as titanium (Ti), gold (Au), silver (Ag), copper (Cu), indium (In) or an alloy thereof, but the present disclosure is not limited thereto.

The magnetic layer 836 is disposed between the second electrode 835 and the second semiconductor layer 833. The magnetic layer 836 may serve to align a direction of the light emitting element 830 during self-assembling of the light emitting element 830. The light emitting element 830 may be self-aligned such that a region thereof where the magnetic layer 836 is disposed faces the assembly substrate 10. In addition, the light emitting element 830 may be transferred so that the opposite side of the region thereof where the magnetic layer 836 is disposed is disposed on the first reflective electrode RE1. The magnetic layer 836 may be formed of any one of nickel (Ni), iron (Fe), molybdenum (Mo), and cobalt (Co) or an alloy thereof, but is not limited thereto.

The encapsulation layer 837 surrounding at least a portion of the first semiconductor layer 831, the light emitting layer 832, the second semiconductor layer 833, the first electrode 834, and the second electrode 835 is disposed. The encapsulation layer 837 is formed of an insulating material and may protect the first semiconductor layer 831, the light emitting layer 832, and the second semiconductor layer 833. The encapsulation layer 837 may be disposed to cover side surfaces of the first semiconductor layer 831, the light emitting layer 832, and the second semiconductor layer 833. The first electrode 834 and the second electrode 835 may be exposed from the encapsulation layer 837, so that the first electrode 834 and the second electrode 835 may be respectively electrically connected to the first reflective electrode RE1 and the connection electrode CE.

The light emitting element 830 may be configured as a vertical type light emitting element in which the first electrode 834, the first semiconductor layer 831, the light emitting layer 832, the second semiconductor layer 833, the magnetic layer 836, and the second electrode 835 are stacked in sequence. A cross-sectional area of the light emitting element 830 may increase from one side thereof where the magnetic layer 836 is disposed to an opposite side thereof. In other words, the light emitting element 830 may have a cross-sectional width increasing from one side thereof where the magnetic layer 836 is disposed to the opposite side thereof.

Meanwhile, the light emitting element 830 may further include a reflective layer. The reflective layer may cover a portion of the encapsulation layer 837 and may be disposed to surround the side surfaces of the first semiconductor layer 831, the light emitting layer 832, and the second semiconductor layer 833. The reflective layer may be formed of a conductive material having excellent reflective properties. When the light emitting element 830 includes the reflective layer, the amount of light extracted to the outside of the light emitting element 830 may increase, and light efficiency of the display device 800 may increase.

The connection electrode CE is an electrode for electrically connecting the light emitting element 830 and the driving transistor DT. The connection electrode CE may be connected to the second reflective electrode RE2 through a contact hole formed in the third planarization layer 618 and the second planarization layer 617. Accordingly, the connection electrode CE may be electrically connected to one of the source electrode SE and the drain electrode DE of the driving transistor DT through the second reflective electrode RE2. Also, the connection electrode CE may be connected to the second electrode 835 of the light emitting element 830 through a contact hole formed in the third planarization layer 618. Accordingly, the connection electrode CE may electrically connect the driving transistor DT with the second electrode 835 and the second semiconductor layer 833 of the light emitting element 830.

The display device 800 according to another exemplary aspect of the present disclosure may allow for minimization of a transfer tolerance and improvements in quality of the display device 800 through a reduction of a transfer process. In addition, since the process is simplified, process equipment and manufacturing costs may be reduced, and productivity may be improved. That is, the process of the display device 800 may be optimized.

The light emitting element 830 according to still another exemplary aspect of the present disclosure may be configured to have the cross-sectional area increasing from one side thereof where the magnetic layer 836 is disposed to the opposite side thereof. Thus, when the light emitting element 830 is self-assembled, friction between the light emitting element 830 and an inner sidewall of the pocket portion OLH may be minimized. Therefore, self-assembling of the light emitting element 830 may be performed more stably.

In the light emitting element 830 according to still another exemplary aspect of the present disclosure, a surface of the magnetic layer 836 and a surface of the second electrode 835 in contact with the magnetic layer 836 may have an uneven portion. Accordingly, it is possible to increase diffused reflection effects by the uneven portion. Therefore, even if the magnetic layer 836 is disposed in the emission direction, a decrease in light efficiency of the light emitting element 830 may be prevented.

In addition, the light emitting element 830 may further include a reflective layer surrounding the side surfaces of the first semiconductor layer 831, the light emitting layer 832, and the second semiconductor layer 833. When the light emitting element 830 includes the reflective layer, light extraction efficiency of the light emitting element 830 may be further increased.

Figure 9A:
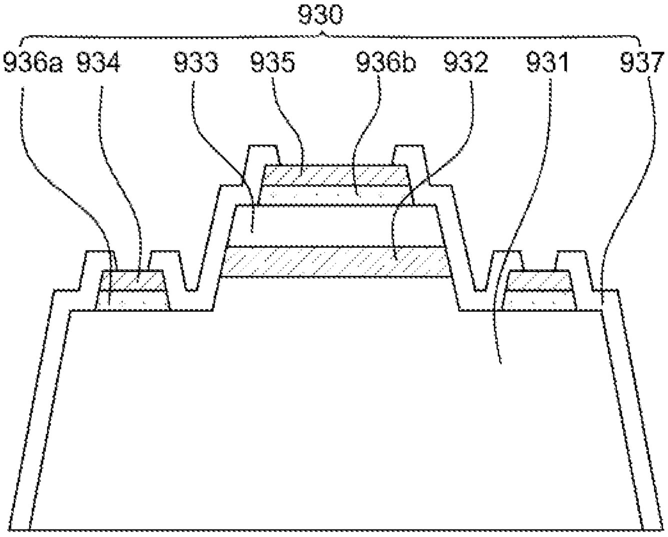
FIG. 9A is a cross-sectional view of a light emitting element according to still another exemplary aspect of the present disclosure.
Figure 9B:
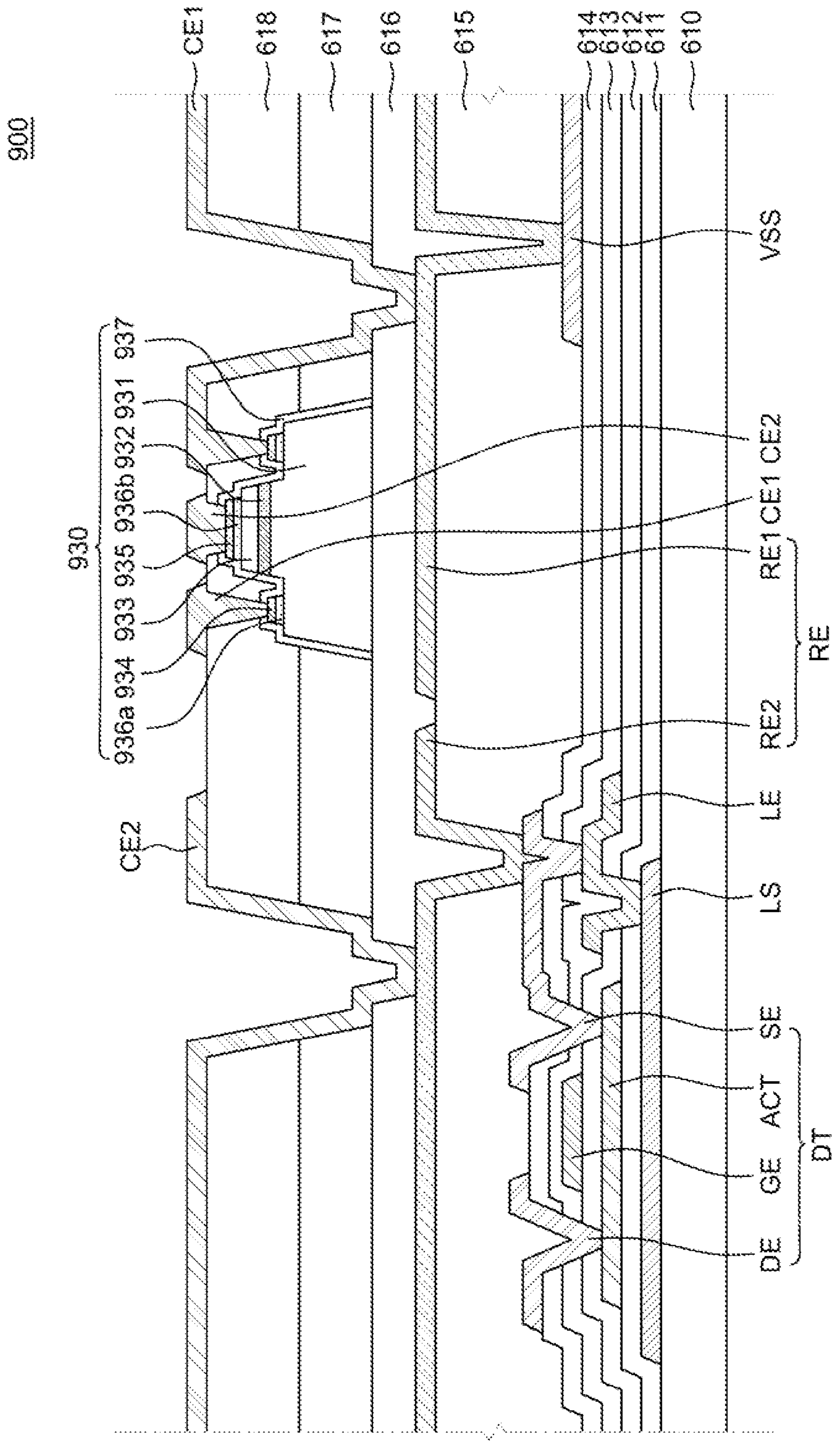
FIG. 9B is a cross-sectional view of a display device according to still another exemplary aspect of the present disclosure.

FIG. 9A is a cross-sectional view of a light emitting element according to still another exemplary aspect of the present disclosure. FIG. 9B is a cross-sectional view of a display device according to still another exemplary aspect of the present disclosure. Since other configurations of a display device 900 of FIGS. 9A and 9B are substantially identical to those of the display device 600 of FIGS. 6A and 6B except for differences in terms of a structure of a light emitting element 930 and a connection structure between the light emitting element 930 and the display device 900, redundant descriptions thereof will be omitted.

Referring to FIGS. 9A and 9B, the display device 900 includes the substrate 610, the buffer layer 611, the gate insulating layer 612, the first interlayer insulating layer 613, the second interlayer insulating layer 614, the first planarization layer 615, the adhesive layer 616, the second planarization layer 617, the third planarization layer 618, the driving transistor DT, the light emitting element 930, the plurality of reflective electrodes RE, the connection electrodes CE1 and CE2, the light shielding layer LS, and the auxiliary electrode LE.

The light emitting element 930 is disposed on the adhesive layer 616. The light emitting element 930 is an element that emits light by current. The light emitting elements 930 may include light emitting elements 930 that emit red light, green light, blue light, and the like, and through a combination thereof, may implement light of various colors including white. For example, the light emitting element 930 may be a light emitting diode (LED) or a micro-LED, but is not limited thereto.

The light emitting element 930 includes a first semiconductor layer 931, a light emitting layer 932, a second semiconductor layer 933, first electrodes 934, a second electrode 935, magnetic layers 936*a* and 936*b*, and an encapsulation layer 937.

The first semiconductor layer 931 is disposed on the adhesive layer 616, and the second semiconductor layer 933 is disposed on the first semiconductor layer 931. The first semiconductor layer 931 and the second semiconductor layer 933 may be layers formed by doping a specific material with n-type impurities and p-type impurities. For example, each of the first semiconductor layer 931 and the second semiconductor layer 933 may be layers formed by doping materials such as gallium nitride (GaN), indium aluminum phosphide (InAlP), gallium arsenide (GaAs), and the like, with n-type impurities or p-type impurities. In addition, the p-type impurity may be magnesium (Mg), zinc (Zn), beryllium (Be) or the like, and the n-type impurity may be silicon (Si), germanium (Ge), tin (Sn) or the like, but the present disclosure is not limited thereto.

The light emitting layer 932 is disposed between the first semiconductor layer 931 and the second semiconductor layer 933. The light emitting layer 932 may emit light by receiving holes and electrons from the first semiconductor layer 931 and the second semiconductor layer 933. The light emitting layer 932 may have a single or multi-quantum well (MQW) structure, and may be formed of, for example, indium gallium nitride (InGaN) or gallium nitride (GaN), but is not limited thereto.

The first electrode 934 is disposed on the first semiconductor layer 931. The first electrode 934 is an electrode for electrically connecting the first semiconductor layer 931 and the low potential power supply line VSS. The first electrodes 934 may be configured as two first electrodes. The first electrode 934 may be formed of a conductive material, for example, a transparent conductive material such as indium tin oxide (ITO) or indium zinc oxide (IZO), or an opaque conductive material such as titanium (Ti), gold (Au), silver (Ag), copper (Cu), indium (In) or an alloy thereof, but the present disclosure is not limited thereto.

The second electrode 935 is disposed on the second semiconductor layer 933. The second electrode 935 is an electrode that electrically connects the second semiconductor layer 933 and the driving transistor DT. The second electrode 935 may be formed of a conductive material, for example, a transparent conductive material such as indium tin oxide (ITO) or indium zinc oxide (IZO), or an opaque conductive material such as titanium (Ti), gold (Au), silver (Ag), copper (Cu), indium (In) or an alloy thereof, but the present disclosure is not limited thereto.

The magnetic layers 936*a* and 936*b* include a first magnetic layer 936*a* and a second magnetic layer 936*b*. The first magnetic layer 936*a* is disposed between the first electrode 934 and the first semiconductor layer 931. The first magnetic layer 936*a* may be configured as two first magnetic layers 936*a* in the same manner as the first electrode 934. The second magnetic layer 936*b* is disposed between the second electrode 935 and the second semiconductor layer 933. The magnetic layers 936*a* and 936*b* may serve to align a direction of the light emitting element 930 during self-assembling of the light emitting element 930. The light emitting element 930 may be self-aligned such that a region thereof where the magnetic layers 936*a* and 936*b* are disposed faces the assembly substrate 10. In addition, the light emitting element 930 may be transferred such that an opposite side of the region thereof where the magnetic layers 936*a* and 936*b* are disposed is disposed on the adhesive layer 616. The magnetic layer 936 may be formed of any one of nickel (Ni), iron (Fe), molybdenum (Mo), and cobalt (Co) or an alloy thereof, but is not limited thereto.

The encapsulation layer 937 surrounding at least a portion of the first semiconductor layer 931, the light emitting layer 932, the second semiconductor layer 933, the first electrode 934, the second electrode 935, and the magnetic layers 936*a* and 936*b* is disposed. The encapsulation layer 937 is formed of an insulating material and may protect the first semiconductor layer 931, the light emitting layer 932, and the second semiconductor layer 933. The encapsulation layer 937 may be disposed to cover side surfaces of the first semiconductor layer 931, the light emitting layer 932, and the second semiconductor layer 933. In addition, the encapsulation layer 937 may be disposed to cover portions of upper surfaces of the first semiconductor layer 931 and the second semiconductor layer 933. The first electrode 934 and the second electrode 935 may be exposed from the encapsulation layer 937, so that the connection electrodes CE1 and CE2 and the first electrode 934 and the second electrode 935 may be electrically connected.

The light emitting element 930 is configured to include two first electrodes 934, two first magnetic layers 936*a*, one second electrode 935, and one second magnetic layer 936*b*. The light emitting element 930 may be configured as an NPN type light emitting element in which two first magnetic layers 936*a* and two first electrodes 934 are disposed on a portion of the first semiconductor layer 931, and one second magnetic layer 936*b* and one second electrode 935 are disposed on another portion of the first semiconductor layer 931. The light emitting element 930 may have a cross-sectional area increasing from one side thereof where the magnetic layers 936*a* and 936*b* are disposed to an opposite side thereof. In other words, the light emitting element 930 may have a cross-sectional width increasing from one side thereof where the magnetic layers 936*a* and 936*b* are disposed to an opposite side thereof.

Meanwhile, the light emitting element 930 may further include a reflective layer. The reflective layer may be disposed to cover a portion of the encapsulation layer 937 and to surround at least a side surface of the first semiconductor layer 931. The reflective layer may be formed of a conductive material having excellent reflective properties. When the light emitting element 930 includes the reflective layer, the amount of light extracted to the outside of the light emitting element 930 may increase, and light efficiency of the display device 900 may increase.

The first connection electrode CE1 is an electrode for electrically connecting the light emitting element 930 and the low potential power supply line VSS. The first connection electrode CE1 may be connected to the first reflective electrode RE1 through a contact hole formed in the third planarization layer 618, the second planarization layer 617, and the adhesive layer 616. Accordingly, the first connection electrode CE1 may be electrically connected to the low potential power supply line VSS through the first reflective electrode RE1. Also, the first connection electrode CE1 may be connected to the two first electrodes 934 of the light emitting element 930 through contact holes formed in the third planarization layer 618. Accordingly, the first connection electrode CE1 may electrically connect the low potential power supply line VSS with the first electrodes 934 and the first semiconductor layer 931 of the light emitting element 930.

The second connection electrode CE2 is an electrode for electrically connecting the light emitting element 930 and the driving transistor DT. The second connection electrode CE2 may be connected to the second reflective electrode RE2 through a contact hole formed in the third planarization layer 618, the second planarization layer 617, and the adhesive layer 616. Accordingly, the second connection electrode CE2 may be electrically connected to one of the source electrode SE and the drain electrode DE of the driving transistor DT through the second reflective electrode RE2. Also, the second connection electrode CE2 may be connected to the second electrode 935 of the light emitting element 930 through the contact hole formed in the third planarization layer 618. Accordingly, the second connection electrode CE2 may electrically connect the driving transistor DT with the second electrode 935 and the second semiconductor layer 933 of the light emitting element 930.

The display device 900 according to another exemplary aspect of the present disclosure allow for minimization of a transfer tolerance and improvements in quality of the display device 900 through a reduction of a transfer process. In addition, since the process is simplified, process equipment and manufacturing costs may be reduced, and productivity may be improved. That is, the process of the display device 900 may be optimized.

The light emitting element 930 according to still another exemplary aspect of the present disclosure may be configured to have the cross-sectional area increasing from one side thereof where the magnetic layers 936*a* and 936*b* are disposed to the opposite side thereof. Thus, when the light emitting element 930 is self-assembled, friction between the light emitting element 930 and an inner sidewall of the pocket portion OLH may be minimized. Therefore, self-assembling of the light emitting element 930 may be performed more stably.

In the light emitting element 930 according to still another exemplary aspect of the present disclosure, surfaces of the magnetic layers 936*a* and 936*b* and a surface of the first electrode 934 or the second electrode 935 in contact with the magnetic layers 936*a* and 936*b* may be configured to have an uneven portion. Accordingly, it is possible to increase diffused reflection effects by the uneven portion. Therefore, even if the magnetic layers 936*a* and 936*b* are disposed in the emission direction, decrease in light efficiency of the light emitting element 930 can be prevented.

In addition, the light emitting element 930 may further include a reflective layer surrounding at least a side surface of the first semiconductor layer 931. When the light emitting element 930 includes the reflective layer, light extraction efficiency of the light emitting element 930 may be further increased.

The exemplary aspects of the present disclosure may also be described as follows:

According to an aspect of the present disclosure, a light emitting element includes at least one first electrode, a first semiconductor layer, a light emitting layer, a second semiconductor layer, a second electrode, and at least one magnetic layer, wherein the magnetic layer is disposed between the first electrode and the first semiconductor layer or between the second electrode and the second semiconductor layer, wherein a cross-sectional area of the light emitting element increases from one side where the magnetic layer is disposed to an opposite side.

The light emitting element may be a vertical type light emitting element in which the first electrode, the magnetic layer, the first semiconductor layer, the light emitting layer, the second semiconductor layer, and the second electrode are stacked in sequence.

The light emitting element may further include a first reflective layer disposed to surround side surfaces of the first semiconductor layer, the light emitting layer, and the second semiconductor layer.

The light emitting element may further include a second reflective layer disposed between the magnetic layer and the first semiconductor layer.

The light emitting element may be a vertical type light emitting element in which the first electrode, the first semiconductor layer, the light emitting layer, the second semiconductor layer, the magnetic layer, and the second electrode are stacked in sequence.

The at least one magnetic layer may include at least one first magnetic layer disposed between the first electrode and the first semiconductor layer; and a second magnetic layer disposed between the second electrode and the second semiconductor layer.

The at least one first electrode may be one and the at least one first magnetic layer may be one. The light emitting element may be a lateral type light emitting element in which the first magnetic layer and the first electrode are disposed on a portion of the first semiconductor layer, and the second magnetic layer and the second electrode may be disposed on another portion of the first semiconductor layer.

The at least first electrode may be two and the at least one first magnetic layer may be two. The light emitting element may be an NPN type light emitting element in which the first magnetic layers and the first electrodes are disposed on a portion of the first semiconductor layer, and the second magnetic layer and the second magnetic layer may be disposed on another portion of the first semiconductor layer.

The light emitting element may further include a reflective layer disposed to surround at least a side surface of the first semiconductor layer.

According to another aspect of the present disclosure, a display device includes a substrate including a plurality of sub-pixels; transistors disposed in each of the plurality of sub-pixels; a first assembly electrode and a second assembly electrode disposed in each of the plurality of sub-pixels and spaced apart from each other; a passivation layer covering the first assembly electrode and the second assembly electrode; and a plurality of light emitting elements disposed on the passivation layer between the first assembly electrode and the second assembly electrode and including a first electrode, a first semiconductor layer, a light emitting layer, a second semiconductor layer, a second electrode, and a magnetic layer, wherein the magnetic layer is disposed between the first electrode and the first semiconductor layer, wherein a cross-sectional width of the plurality of light emitting elements have increases from one side where the magnetic layer is disposed to an opposite side.

The plurality of light emitting elements may be configured as a vertical type light emitting element in which the first electrode, the magnetic layer, the first semiconductor layer, the light emitting layer, the second semiconductor layer, and the second electrode are stacked in sequence.

The first electrode may be electrically connected to the first assembly electrode and the second assembly electrode, and the second electrode may be electrically connected to the transistor.

The plurality of light emitting elements may further include a first reflective layer disposed to surround side surfaces of the first semiconductor layer, the light emitting layer, and the second semiconductor layer.

The plurality of light emitting elements may further include a second reflective layer between the magnetic layer and the first semiconductor layer.

The second reflective layer may be formed of a material having higher reflectance than the magnetic layer.

According to still another aspect of the present disclosure, a display device includes a substrate including a plurality of sub-pixels; transistors disposed in each of the plurality of sub-pixels; a lower reflective layer disposed in each of the plurality of sub-pixels; and a plurality of light emitting elements disposed in each of the plurality of sub-pixels on the lower reflective layer and including at least one first electrode, a first semiconductor layer, a light emitting layer, a second semiconductor layer, a second electrode, and at least one magnetic layer, wherein the magnetic layer is disposed between the first electrode and the first semiconductor layer or between the second electrode and the second semiconductor layer, wherein a cross-sectional width of the plurality of light emitting elements increases from one side where the magnetic layer is disposed to an opposite side.

The plurality of light emitting elements may be configured as a vertical type light emitting element in which the first electrode, the first semiconductor layer, the light emitting layer, the second semiconductor layer, the magnetic layer, and the second electrode are stacked in sequence.

The at least one magnetic layer may further include at least one first magnetic layer disposed between the first electrode and the first semiconductor layer; and a second magnetic layer disposed between the second electrode and the second semiconductor layer.

The at least one first electrode may be one and the at least one first magnetic layer may be one. The plurality of light emitting elements may be configured as a lateral type light emitting element in which the first magnetic layer and the first electrode may be disposed on a portion of the first semiconductor layer, and the second magnetic layer and the second electrode may be disposed on another portion of the first semiconductor layer.

The at least first electrode may be two and the at least one first magnetic layer may be two. The plurality of light emitting elements may be configured as an NPN type light emitting element in which the first magnetic layers and the first electrodes are disposed on a portion of the first semiconductor layer, and the second magnetic layer and the second magnetic layer may be disposed on another portion of the first semiconductor layer.

The first electrode may be electrically connected to a low potential power supply line, and the second electrode may be electrically connected to the transistor.

The display device may further include a reflective layer disposed to surround at least a side surface of the first semiconductor layer.

At least one of a surface of the magnetic layer and a surface of the first electrode or the second electrode in contact with the magnetic layer may have an uneven portion.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A light emitting element, comprising:

at least one first electrode, a first semiconductor layer, a light emitting layer, a second semiconductor layer, a second electrode, and at least one magnetic layer, wherein the at least one magnetic layer is disposed between the at least one first electrode and the first semiconductor layer or between the second electrode and the second semiconductor layer, wherein the light emitting element has a cross-sectional area increasing from one side where the at least one magnetic layer is disposed to an opposite side, wherein the at least one magnetic layer includes:

at least one first magnetic layer disposed between the at least one first electrode and the first semiconductor layer; and a second magnetic layer disposed between the second electrode and the second semiconductor layer, wherein the light emitting element includes both the at least one first magnetic layer and the second magnetic layer, wherein the at least one first electrode is two first electrodes and the at least one first magnetic layer is two first magnetic layers, and wherein the light emitting element is an NPN type light emitting element in which the two first magnetic layers and the two first electrodes are disposed on a portion of the first semiconductor layer, and the second magnetic layer and the second electrode are disposed on another portion of the first semiconductor layer.

2. The light emitting element of claim 1, further comprising a reflective layer surrounding at least a side surface of the first semiconductor layer.

3. A display device, comprising:

a substrate including a plurality of sub-pixels;

a plurality of transistors disposed in each of the plurality of sub-pixels;

a planarization layer on the plurality of transistors;

a first assembly electrode and a second assembly electrode disposed on the planarization layer in each of the plurality of sub-pixels and spaced apart from each other;

a passivation layer covering the first assembly electrode and the second assembly electrode; and a plurality of light emitting elements disposed on the passivation layer between the first assembly electrode and the second assembly electrode and including a first electrode, a first semiconductor layer, a light emitting layer, a second semiconductor layer, a second electrode, and a magnetic layer, wherein the magnetic layer is disposed between the first electrode and the first semiconductor layer, wherein the plurality of light emitting elements have a cross-sectional width increasing from one side where the magnetic layer is disposed to an opposite side, wherein the passivation layer is disposed between the first assembly electrode and the plurality of light emitting elements, and between the second assembly electrode and the plurality of light emitting elements, and wherein the first assembly electrode and the second assembly electrode are disposed between the planarization layer and the passivation layer.

4. The display device of claim 3, wherein the plurality of light emitting elements are configured as vertical type light emitting elements in which the first electrode, the magnetic layer, the first semiconductor layer, the light emitting layer, the second semiconductor layer, and the second electrode are stacked in this sequence.

5. The display device of claim 3, wherein the first electrode is electrically connected to the first assembly electrode and the second assembly electrode, and wherein the second electrode is electrically connected to the plurality of transistors.

6. The display device of claim 3, wherein the plurality of light emitting elements further include a first reflective layer surrounding side surfaces of the first semiconductor layer, the light emitting layer, and the second semiconductor layer.

7. The display device of claim 6, wherein the plurality of light emitting elements further includes a second reflective layer between the magnetic layer and the first semiconductor layer.

8. The display device of claim 7, wherein the second reflective layer is formed of a material having higher reflectance than the magnetic layer.

9. A display device, comprising:

a substrate including a plurality of sub-pixels;

a plurality of transistors disposed in each of the plurality of sub-pixels;

a planarization layer on the plurality of transistors;

a first lower reflective layer and a second lower reflective layer disposed on the planarization layer and in each of the plurality of sub-pixels; and a plurality of light emitting elements disposed in each of the plurality of sub-pixels on the first lower reflective layer or the second lower reflective layer and including at least one first electrode, a first semiconductor layer, a light emitting layer, a second semiconductor layer, a second electrode, and at least one magnetic layer, wherein the at least one magnetic layer is disposed between the at least one first electrode and the first semiconductor layer or between the second electrode and the second semiconductor layer, wherein the plurality of light emitting elements have a cross-sectional width increasing from one side where the magnetic layer is disposed to an opposite side, and wherein the first lower reflective layer is electrically connected to the at least one first electrode and the second lower reflective layer is electrically connected to the second electrode.

10. The display device of claim 9, wherein the at least one magnetic layer is disposed between the second electrode and the second semiconductor layer, and wherein the plurality of light emitting elements are configured as vertical type light emitting elements in which the first electrode, the first semiconductor layer, the light emitting layer, the second semiconductor layer, and the second electrode are stacked in this sequence.

11. The display device of claim 9, wherein the at least one magnetic layer further includes, at least one first magnetic layer disposed between the at least one first electrode and the first semiconductor layer; and a second magnetic layer disposed between the second electrode and the second semiconductor layer.

12. The display device of claim 11, wherein the at least one first electrode is one first electrode and the at least one first magnetic layer is one first magnetic layer, wherein the plurality of light emitting elements are configured as lateral type light emitting elements in which the one first magnetic layer and the one first electrode are disposed on a portion of the first semiconductor layer, and the second magnetic layer and the second electrode are disposed on another portion of the first semiconductor layer.

13. The display device of claim 11, wherein the at least one first electrode is two first electrodes and the at least one first magnetic layer is two first magnetic layers, wherein the plurality of light emitting elements are configured as NPN type light emitting elements in which the two first magnetic layers and the two first electrodes are disposed on a portion of the first semiconductor layer, and the second magnetic layer and the second electrode are disposed on another portion of the first semiconductor layer.

14. The display device of claim 9, wherein the first electrode is electrically connected to a low potential power supply line, and wherein the second electrode is electrically connected to the transistor.

15. The display device of claim 9, further comprising a reflective layer surrounding at least a side surface of the first semiconductor layer.

16. The display device of claim 9, wherein at least one of a surface of the at least one magnetic layer and a surface of the at least one first electrode or the second electrode in contact with the at least one magnetic layer has an uneven portion.

* * * * *